(12) United States Patent
Nakanishi et al.

(10) Patent No.: US 12,224,778 B2
(45) Date of Patent: Feb. 11, 2025

(54) DICTIONARY COMPRESSOR, DATA COMPRESSION DEVICE, AND MEMORY SYSTEM

(71) Applicant: Kioxia Corporation, Tokyo (JP)

(72) Inventors: Keiri Nakanishi, Kawasaki Kanagawa (JP); Sho Kodama, Kawasaki Kanagawa (JP); Daisuke Yashima, Tachikawa Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 146 days.

(21) Appl. No.: 18/118,732

(22) Filed: Mar. 7, 2023

(65) Prior Publication Data

US 2023/0403027 A1 Dec. 14, 2023

(30) Foreign Application Priority Data

May 27, 2022 (JP) ................. 2022-086924

(51) Int. Cl.
*H03M 7/30* (2006.01)
*H03M 7/40* (2006.01)
*G06F 3/06* (2006.01)

(52) U.S. Cl.
CPC ....... *H03M 7/3088* (2013.01); *H03M 7/4031* (2013.01); *G06F 3/0608* (2013.01); *G06F 3/0659* (2013.01); *H03M 7/40* (2013.01)

(58) Field of Classification Search
CPC .... H03M 7/3088; H03M 7/4031; H03M 7/40; G06F 3/0608; G06F 3/0659
See application file for complete search history.

(56) References Cited

U.S. PATENT DOCUMENTS

| 8,704,686 | B1 | 4/2014 | Agarwal et al. |
| 2020/0169268 | A1 | 5/2020 | Billa et al. |
| 2021/0288662 | A1 | 9/2021 | Fukazawa et al. |
| 2021/0294500 | A1 | 9/2021 | Kodama et al. |
| 2023/0081961 | A1* | 3/2023 | Kodama ............... G06F 3/0679 711/103 |

FOREIGN PATENT DOCUMENTS

| JP | 2018-081611 A | 5/2018 |
| JP | 2021-149416 A | 9/2021 |

* cited by examiner

*Primary Examiner* — Joseph J Lauture
(74) *Attorney, Agent, or Firm* — Maier & Maier, PLLC

(57) ABSTRACT

According to one embodiment, a dictionary compressor for compressing input first data includes a buffer and a search unit. The buffer stores data input to the dictionary compressor prior to the first data. The search unit acquires, from the first data, partial data strings each having a first data length and having head positions in the first data, respectively, that are sequentially shifted by a second data length shorter than the first data length. The search unit performs search processes in parallel and acquires search results respectively corresponding to the search processes, the search processes searching the buffer to acquire respective match data strings that at least partially match the partial data strings, respectively.

14 Claims, 19 Drawing Sheets

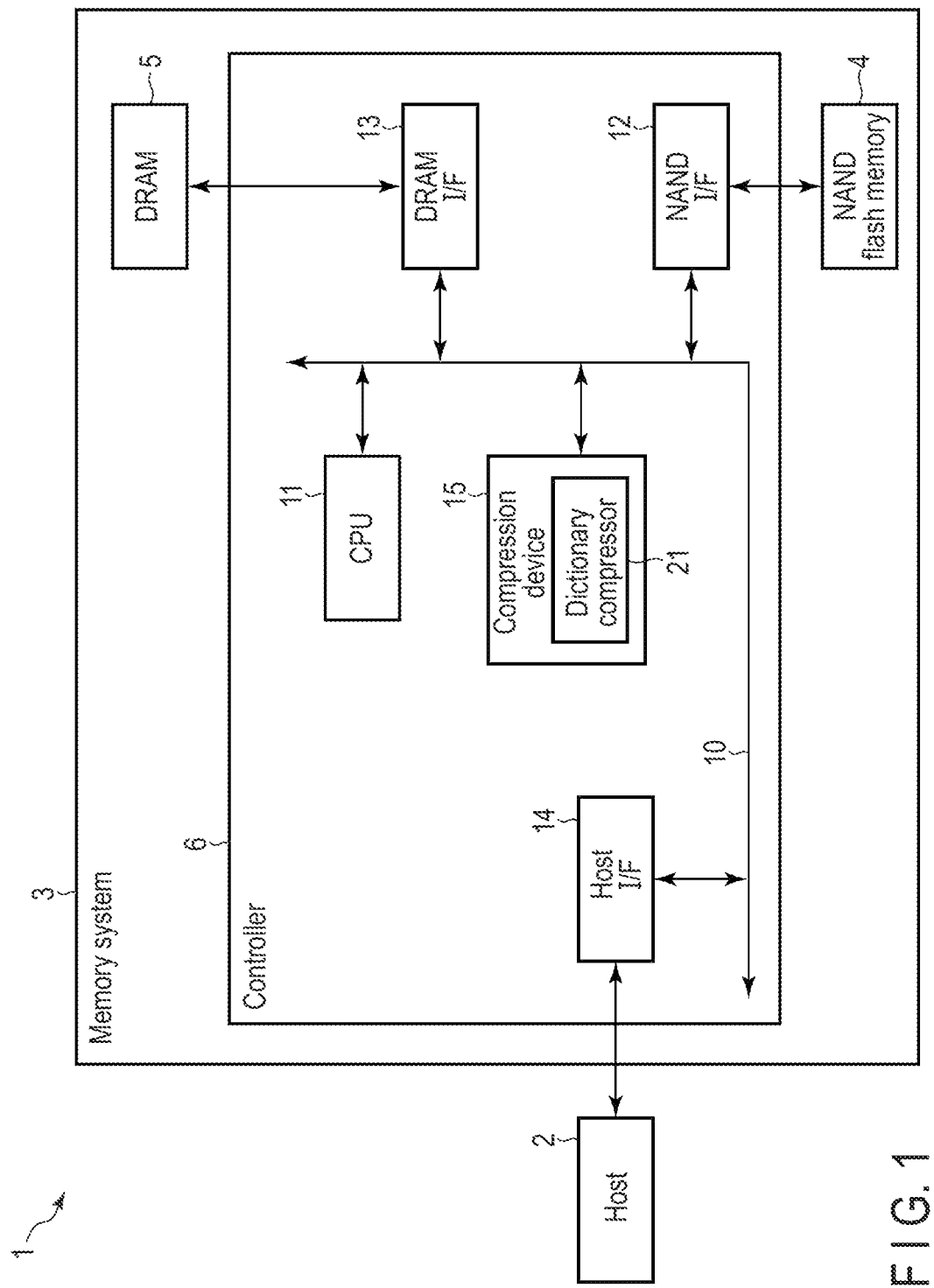
F I G. 1

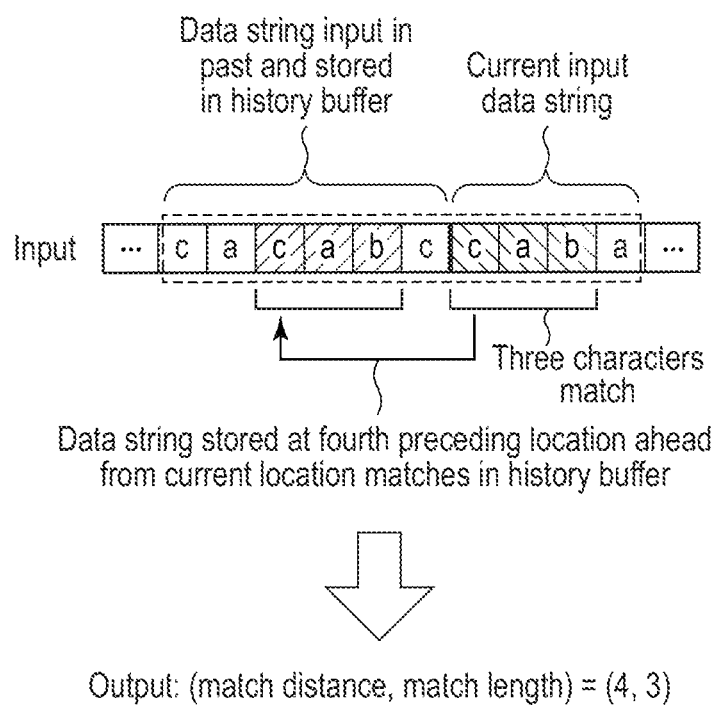
F I G. 2

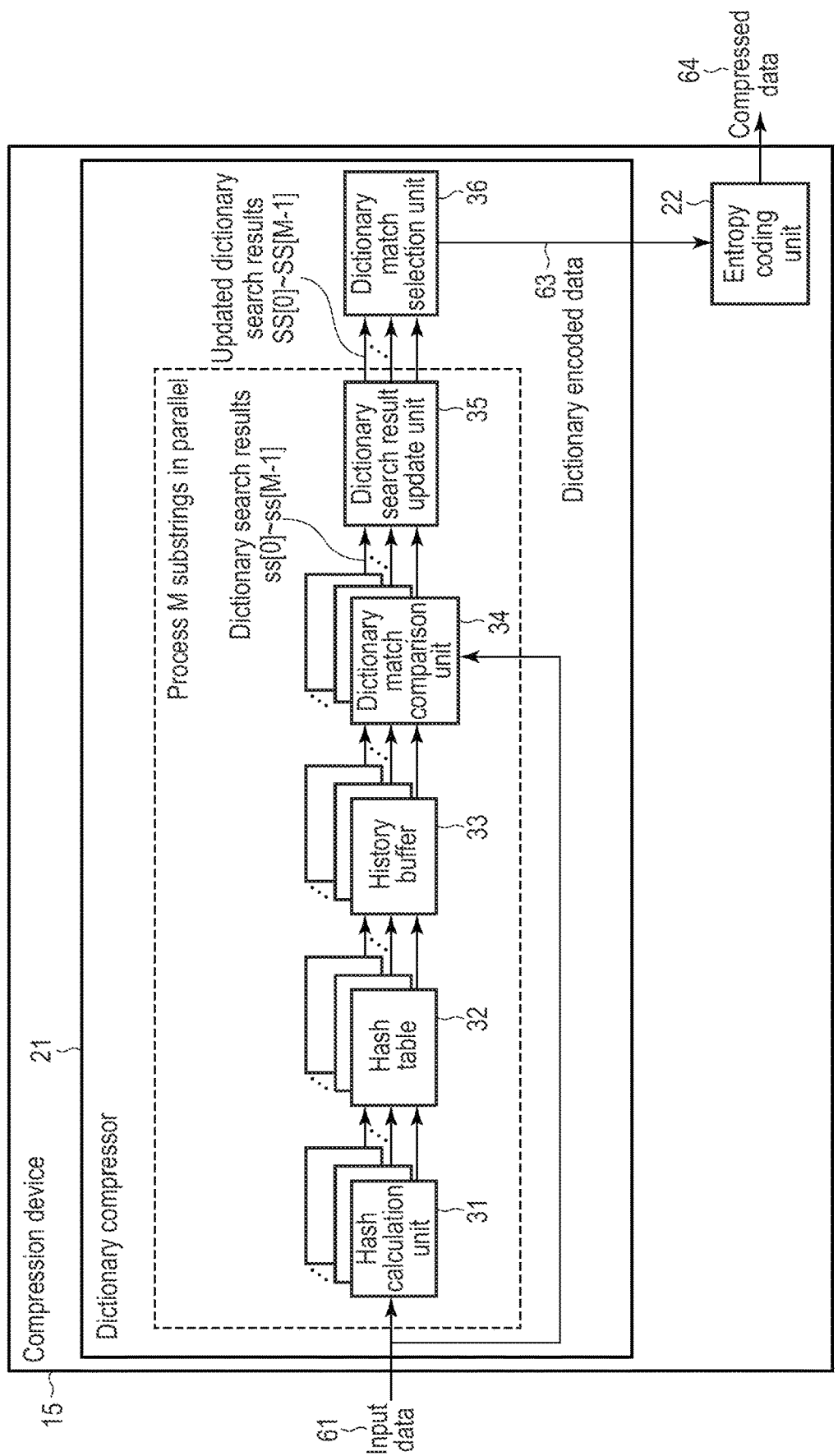
F I G. 3

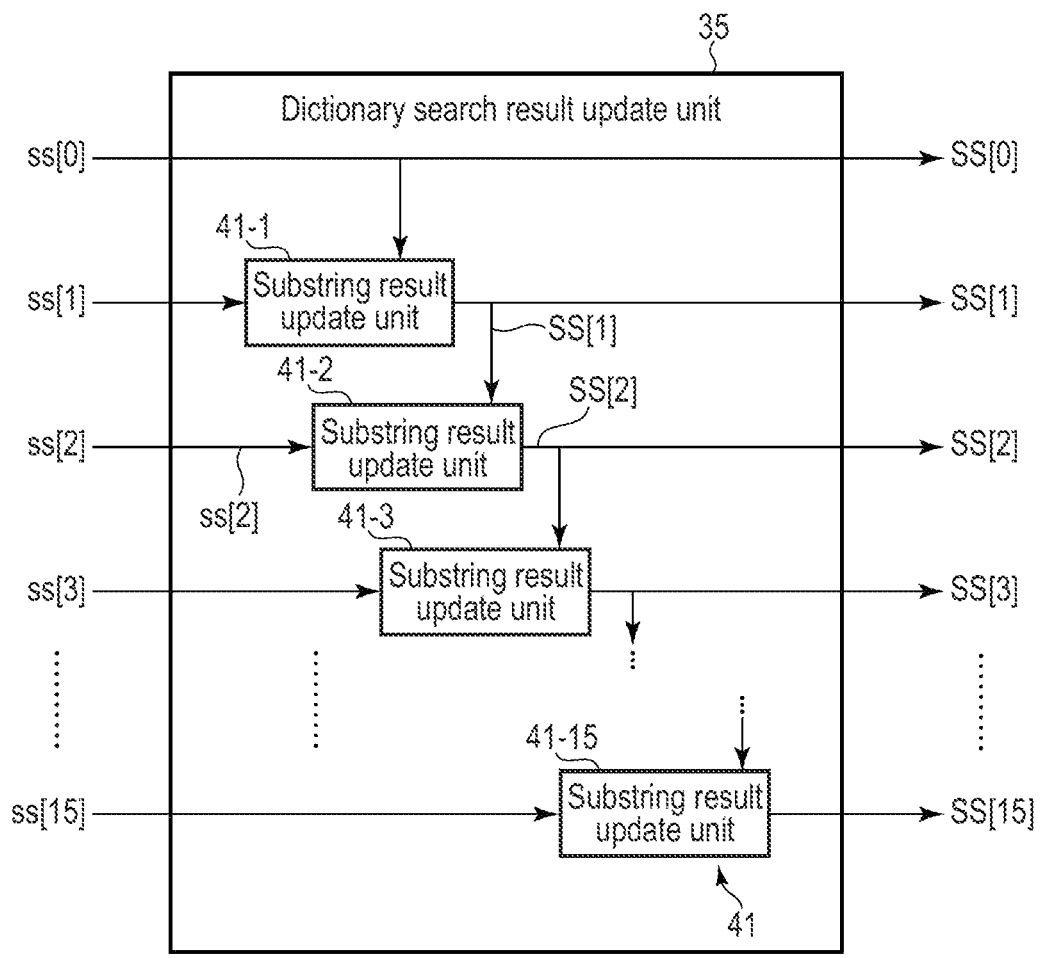
F I G. 4

Hash table

| Hash value | Bank and address |
|---|---|
| H(012···) | 0, 4 |
| H(123···) | 0, 5 |
| H(234···) | 0, 6 |
| H(567···) | 2, 4 |
| H(678···) | 2, 5 |
| H(789···) | 2, 6 |
| H(cde···) | 4, 4 |
| H(def···) | 4, 5 |
| ...... | ...... |

32

F I G. 6

33

| bank | ... | address=4 | | | | | | | | address=5 | | | | | | | | address=6 | | | | | |
|---|---|---|---|---|---|---|---|---|---|---|---|---|---|---|---|---|---|---|---|---|---|---|---|
| 0 | ... | 0 | 1 | 2 | 3 | 4 | 5 | 6 | 7 | 1 | 2 | 3 | 4 | 5 | 6 | 7 | 8 | 2 | 3 | 4 | 5 | 6 | ... |
| 1 | ... | ... | ... | ... | ... | ... | ... | ... | ... | ... | ... | ... | ... | ... | ... | ... | ... | ... | ... | ... | ... | ... | ... |
| 2 | ... | 5 | 6 | 7 | 8 | 9 | a | b | c | 6 | 7 | 8 | 9 | a | b | ... | ... | 7 | 8 | 9 | a | b | ... |
| 3 | ... | ... | ... | ... | ... | ... | ... | ... | ... | ... | ... | ... | ... | ... | ... | ... | ... | ... | ... | ... | ... | ... | ... |
| 4 | ... | c | d | e | f | x | y | z | w | d | e | f | f | ... | ... | ... | ... | ... | ... | ... | ... | ... | ... |
| ... | ... | ... | ... | ... | ... | ... | ... | ... | ... | ... | ... | ... | ... | ... | ... | ... | ... | ... | ... | ... | ... | ... | ... |

F I G. 7

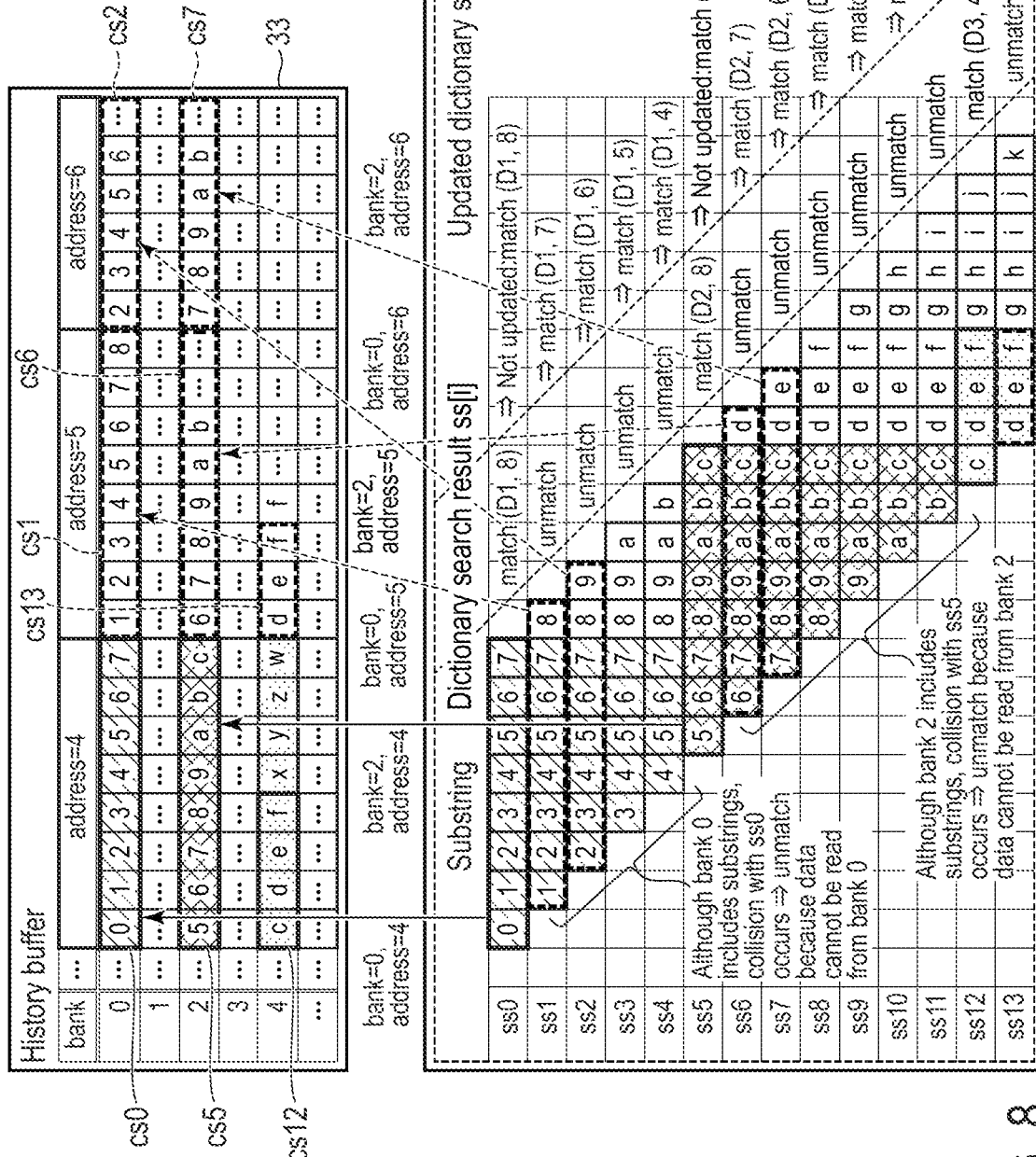
F I G. 8

Substring result update unit

A1 — SS[j].update_flag_A = (SS[i-1].dictionary_match_flag==match) & (ss[j].dictionary_match_flag==unmatch) & (SS[i-1].dictionary_match_length≥threshold);

A2 — SS[j].dictionary_match_flag = (SS[j].update_flag_A)? (SS[i-1].dictionary_match_flag) : (ss[j].dictionary_match_flag);

A3 — SS[j].dictionary_match_distance = (SS[j].update_flag_A)? (SS[i-1].dictionary_match_distance) : (ss[j].dictionary_match_distance);

A4 — SS[j].dictionary_match_length = (SS[j].update_flag_A)? (SS[i-1].dictionary_match_length-1) : (ss[j].dictionary_match_length);

F I G. 10

| | | | | | | | | | |
|---|---|---|---|---|---|---|---|---|---|
| ss0 | 0 | 1 | 2 | 3 | 4 | 5 | 6 | 7 | |
| ss1 | | 1 | 2 | 3 | 4 | 5 | 6 | 7 | 8 |
| ss2 | | | 2 | 3 | 4 | 5 | 6 | 7 | 8 | 9 |
| ss3 | | | | 3 | 4 | 5 | 6 | 7 | 8 | 9 | a |

| Substring | Dictionary search result ss[i] | Updated dictionary search result SS[j] |
|---|---|---|
| ss0 | match (D1, 8) | Not updated: match (D1, 8) |
| ss1 | unmatch | Since first seven characters match SS[0], match(D1, 7) is set for update |
| ss2 | unmatch | Since first six characters match SS[1], match(D1, 6) is set for update |
| ss3 | unmatch | Since first five characters match SS[2], match(D1, 5) is set for update |

F I G. 11

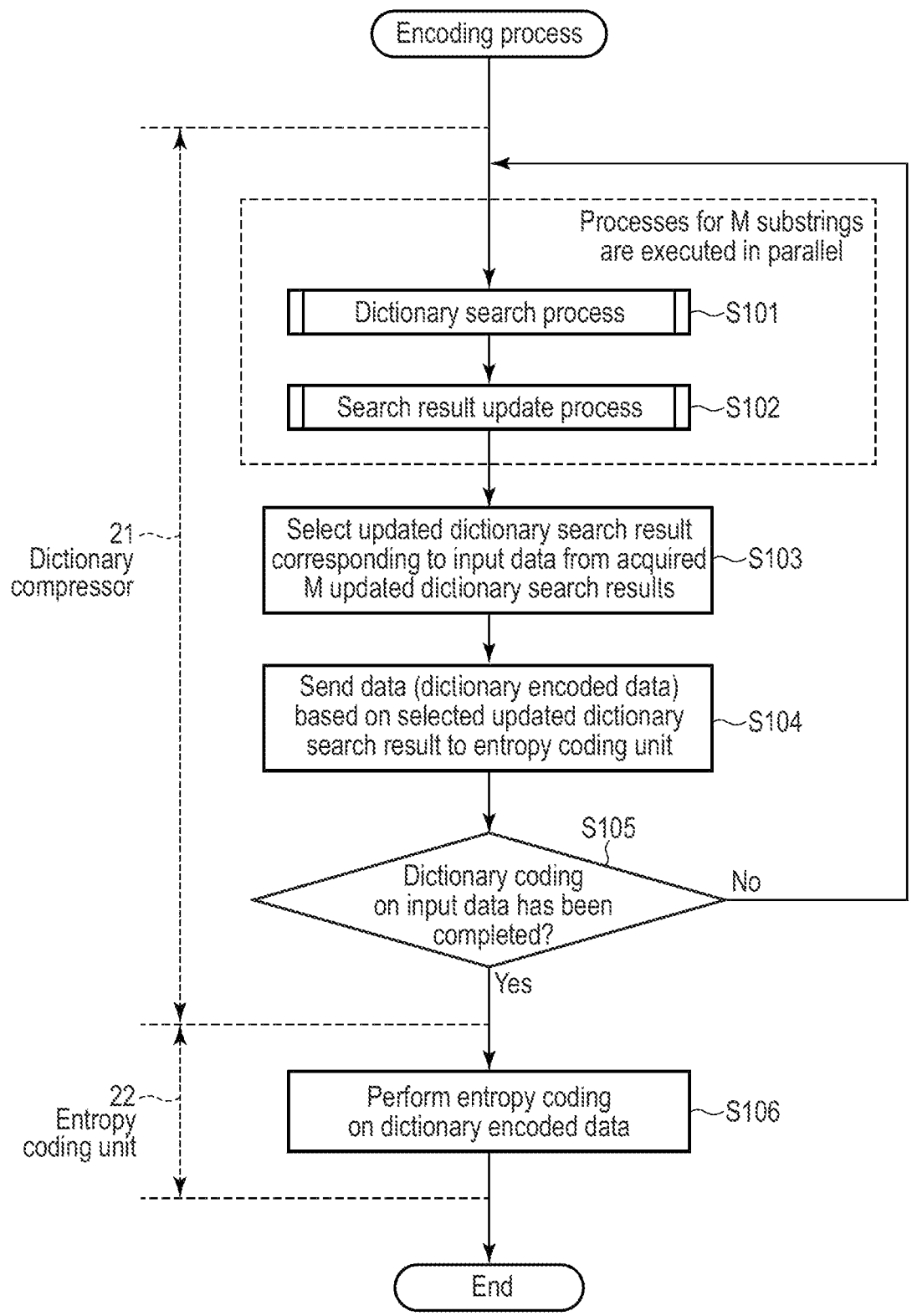
F I G. 12

Substring result update unit

B1: SS[j].update_flag_A = (SS[j-1].dictionary_match_flag==unmatch) & (ss[j].dictionary_match_flag==match) & (SS[j-1].dictionary_match_length≥threshold);

B2: SS[j].update_flag_B = (SS[j-1].dictionary_match_flag==match) & (ss[j].dictionary_match_flag==match) & (SS[j-1].dictionary_match_length-1>ss[j].dictionary_match_length);

B3: SS[j].dictionary_match_flag = (SS[j].update_flag_A)? (SS[j-1].dictionary_match_flag) : (ss[j].dictionary_match_flag);

B4: SS[j].dictionary_match_distance = (SS[j].update_flag_A | SS[j].update_flag_B)? (SS[j-1].dictionary_match_distance) : (ss[j].dictionary_match_distance);

B5: SS[j].dictionary_match_length = (SS[j].update_flag_A | SS[j].update_flag_B)? (SS[j-1].dictionary_match_length-1) : (ss[j].dictionary_match_length);

F I G. 15

| | Substring | | | | | | | | | Dictionary search result ss[] | Updated dictionary search result SS[] |
|---|---|---|---|---|---|---|---|---|---|---|---|
| ss0 | 0 | 1 | 2 | 3 | 4 | 5 | 6 | 7 | | match (D1, 8) | Not updated: match (D1, 8) |
| ss1 | | 1 | 2 | 3 | 4 | 5 | 6 | 7 | 8 | unmatch | Since first seven characters match SS[0], match(D1, 7) is set for update |
| ss2 | | | 2 | 3 | 4 | 5 | 6 | 7 | 8 9 | match (D2, 3) | Since using SS[1] lengthens match length, match(D1, 6) is set for update |
| ss3 | | | | 3 | 4 | 5 | 6 | 7 | 8 9 a | unmatch | Since first five characters match SS[2], match(D1, 5) is set for update |

Update flag B

F I G. 16

Substring result update unit

C1 SS[j].update_flag_A = (SS[i-1].dictionary_match_flag==match) & (ss[j].dictionary_match_flag==unmatch) & (SS[i-1].dictionary_match_length≥threshold);

C2 SS[j].update_flag_B = (SS[i-1].dictionary_match_flag==match) & (ss[j].dictionary_match_flag==match) & (SS[i-1].dictionary_match_length-1>ss[j].dictionary_match_length);

C3 SS[j].update_flag_C = (SS[i-1].dictionary_match_flag==match) & (ss[j].dictionary_match_flag==match) & (SS[i-1].dictionary_match_length-1==ss[j].dictionary_match_length) & (SS[i-1].dictionary_match_distance<ss[j].dictionary_match_distance);

C4 SS[j].dictionary_match_flag = (SS[j].update_flag_A)? (SS[i-1].dictionary_match_flag) : (ss[j].dictionary_match_flag);

C5 SS[j].dictionary_match_distance = (SS[j].update_flag_A | SS[j].update_flag_B | SS[j].update_flag_C)? (SS[i-1].dictionary_match_distance) : ss[j].dictionary_match_distance);

C6 SS[j].dictionary_match_length = (SS[j].update_flag_A | SS[j].update_flag_B)? (SS[i-1].dictionary_match_length-1) : (ss[j].dictionary_match_length);

F I G. 18

| Substring | Dictionary search result ss[] | Updated dictionary search result SS[] |
|---|---|---|
| ss0: 0 1 2 3 4 5 6 7 | match (64, 8) | Not updated: match (64, 8) |
| ss1: 1 2 3 4 5 6 7 8 | unmatch | Since first seven characters match SS[0], match(64, 7) is set for update |
| ss2: 2 3 4 5 6 7 8 9 | match (4000, 6) | Since using SS[1] shortens match distance and shortens code length, match(64, 6) is set for update |
| ss3: 3 4 5 6 7 8 9 a | unmatch | Since first five characters match SS[2], match(64, 5) is set for update |

Update flag C

F I G. 19

DICTIONARY COMPRESSOR, DATA COMPRESSION DEVICE, AND MEMORY SYSTEM

CROSS-REFERENCE TO RELATED APPLICATIONS

This application is based upon and claims the benefit of priority from Japanese Patent Application No. 2022-086924, filed May 27, 2022, the entire contents of which are incorporated herein by reference.

FIELD

Embodiments described herein relate generally to a technique for performing dictionary compression of data.

BACKGROUND

Storing a large amount of document data as it is in a storage such as a hard disk drive (HDD) and a solid state drive (SSD) bears on the capacity of the storage. This increases the cost for storing data, for example, in a data center.

In general, the amount of data stored in a storage is reduced by performing lossless compression on data and storing the lossless compressed data in the storage. One of methods for lossless compression of data is a method in which dictionary coding and entropy coding are combined. For example, in dictionary coding in deflate or gzip, a history buffer that stores data (for example, a character string) input in the past is used. In the dictionary coding, the history buffer is searched to acquire past data that at least partially matches data to be compressed, and a match distance and a match length are obtained. The match distance is a distance from a position where the data to be compressed is to be stored to a position where the acquired past data is stored, in the history buffer. The match length is the length of a matching portion between the acquired past data and the data to be compressed. The data to be compressed is converted into the match distance and the match length, thereby compressing the data.

In a circuit that implements the dictionary coding, a plurality of partial data strings (that is, substrings) that are obtained by sequentially shifting head positions by a specific data length are acquired from the data to be compressed, and searches of the history buffer based on the plurality of partial data strings are performed in parallel. As a result, a throughput of the dictionary compression can be improved.

However, in a case where the searches of the history buffer based on the plurality of partial data strings are performed in parallel, a past data string may not be read from the history buffer at an appropriate timing due to, for example, shortage of hardware resources. In this case, a partial data string is not converted into a match distance and a match length even though a past data string that at least partially matches the partial data string is stored in the history buffer. The partial data string that has failed to be converted into a match distance and a match length is output as it is without being compressed. Thus, the data compression efficiency decreases.

BRIEF DESCRIPTION OF THE DRAWINGS

FIG. 1 is a block diagram illustrating an example of a configuration of an information processing system that includes a dictionary compressor according to a first embodiment.

FIG. 2 is a view illustrating an example of dictionary coding in the dictionary compressor according to the first embodiment.

FIG. 3 is a block diagram illustrating an example of a configuration of a compression device including the dictionary compressor according to the first embodiment.

FIG. 4 is a block diagram illustrating an example of a configuration of a dictionary search result update unit in the dictionary compressor according to the first embodiment.

FIG. 6 is a view illustrating an example of a configuration of a hash table used in the dictionary compressor according to the first embodiment.

FIG. 7 is a view illustrating an example of data stored in a history buffer in the dictionary compressor according to the first embodiment.

FIG. 8 is a view illustrating an example of dictionary search results and updated dictionary search results that are acquired in the dictionary compressor according to the first embodiment.

FIG. 10 is a view illustrating an example of an operation of a substring result update unit expressed by a program, in the dictionary compressor according to the first embodiment.

FIG. 11 is a view illustrating an example of the updated dictionary search results acquired in the dictionary compressor according to the first embodiment.

FIG. 12 is a flowchart illustrating an example of the procedure of an encoding process executed in the compression device that includes the dictionary compressor according to the first embodiment.

FIG. 15 is a view illustrating an example of an operation of a substring result update unit expressed by a program, in a dictionary compressor according to a second embodiment.

FIG. 16 is a view illustrating an example of updated dictionary search results acquired in the dictionary compressor according to the second embodiment.

FIG. 18 is a view illustrating an example of an operation of a substring result update unit expressed by a program, in a dictionary compressor according to a third embodiment.

FIG. 19 is a view illustrating an example of updated dictionary search results acquired in the dictionary compressor according to the third embodiment.

DETAILED DESCRIPTION

Figure 5:
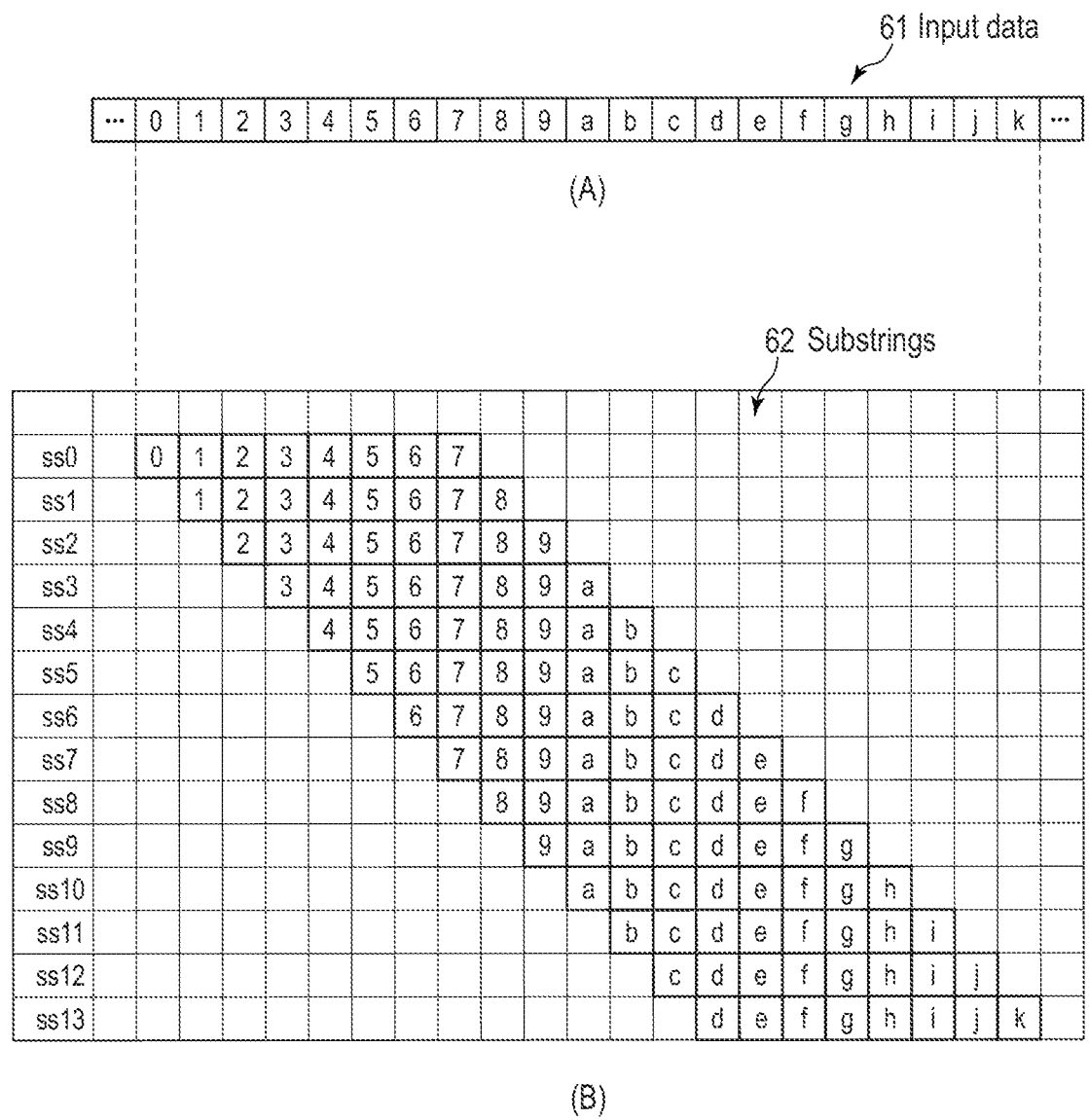
FIG. 5 is a view illustrating (A) an example of input data and (B) an example of a plurality of substrings acquired from the input data, in the dictionary compressor according to the first embodiment.

In general, according to one embodiment, a dictionary compressor for compressing input first data includes a buffer, a search unit, and an update unit. The buffer stores data that is input to the dictionary compressor prior to the first data. The search unit acquires partial data strings from the first data. The partial data strings each have a first data length. The partial data strings have head positions in the first data, respectively, that are sequentially shifted by a second data length that is shorter than the first data length. The search unit performs search processes in parallel. The search processes search the buffer to acquire respective match data strings that at least partially match the partial data strings, respectively.

The search unit acquires search results that correspond to the search processes, respectively. The update unit updates, by using a first search result of the search results, a second search result of the search results that is different from the first search result. The first search result corresponds to a search process of searching the buffer to acquire a match data string that at least partially matches a first partial data string of the partial data strings. The second search result corresponds to a search process of searching the buffer to acquire a match data string that at least partially matches a second partial data string of the partial data strings which is posterior to the first partial data string.

Various embodiments will be described hereinafter with reference to the accompanying drawings.

First Embodiment

FIG. 1 illustrates an example of a configuration of an information processing system that includes a dictionary compressor according to a first embodiment. The information processing system 1 includes a host device 2 and a memory system 3.

The host device 2 is an information processing device that stores data in the memory system 3. The host device 2 is, for example, a storage server that stores a large amount of various types of data in the memory system 3, or a personal computer. Hereinafter, the host device 2 is referred to as the host 2.

The memory system 3 is a semiconductor storage device configured to write data to a nonvolatile memory, and read data from the nonvolatile memory. The nonvolatile memory is, for example, a NAND flash memory 4. The memory system 3 is implemented, for example, as a solid state drive (SSD). Hereinafter, a case where the memory system 3 is implemented as an SSD will be exemplified, but the memory system 3 may be implemented as a hard disk drive (HDD).

The memory system 3 may be used as a storage for the host 2. The memory system 3 may be built in the host 2 or may be connected to the host 2 via a cable or a network.

An interface for connecting the host 2 and the memory system 3 conforms to standards such as SCSI, Serial Attached SCSI (SAS), AT Attachment (ATA), Serial ATA (SATA), PCI Express (PCIe)™, Ethernet™, Fibre channel, and NVM Express (NVMe)™.

The memory system 3 includes, for example, the NAND flash memory 4, a dynamic random access memory (DRAM) 5, and a controller 6.

The NAND flash memory 4 includes one or more memory chips. Each of the memory chips includes multiple blocks. The blocks each function as a minimum unit of a data erase operation. A block may be referred to as an erase block or a physical block. Each of the blocks includes multiple pages. Each of the pages includes multiple memory cells connected to a single word line. The pages each function as a unit of a data write operation and a data read operation. Note that a word line may be used as a unit of a data write operation and a data read operation.

The tolerable maximum number of program/erase cycles (maximum number of P/E cycles) for each of the blocks is limited. One P/E cycle of a block includes an erase operation to erase data stored in all memory cells in the block and a write operation to write data in each page of the block.

The DRAM 5 is a volatile memory. A storage area of the DRAM 5 is allocated as, for example, a storage area of firmware (FW), a cache area of a logical-to-physical address conversion table, and a buffer area of user data.

The controller 6 is a memory controller configured to control the NAND flash memory 4 and the DRAM 5. The controller 6 may be implemented by a circuit such as a system-on-a-chip (SoC). The controller 6 may include a static random access memory (SRAM) or a DRAM. In this case, the DRAM 5 outside the controller 6 is not necessarily provided.

The controller 6 functions as, for example, a flash translation layer (FTL) configured to execute data management and block management of the NAND flash memory 4. The data management executed by the FTL includes (1) management of mapping data indicative of relationship between each logical address and each physical address of the NAND flash memory 4, and (2) process to hide a difference between data read operations/data write operations in units of page and data erase operations in units of block. The block management includes management of defective blocks, wear leveling, and garbage collection.

The logical address is an address used by the host 2 for addressing a storage area of the memory system 3. The logical address is, for example, a logical block address (LBA).

The management of mapping between each logical address and each physical address is executed by using, for example, a logical-to-physical address conversion table. The controller 6 manages mapping between each logical address and each physical address with a certain management size unit by using the logical-to-physical address conversion table. A physical address corresponding to a logical address indicates a physical memory location in the NAND flash memory 4 to which data of the logical address is written. The logical-to-physical address conversion table may be loaded from the NAND flash memory 4 to the DRAM 5 when the memory system 3 is powered on.

Data write into one page is executable only once in a single P/E cycle. Thus, the controller 6 writes update user data corresponding to a logical address not to an original physical memory location in which previous user data corresponding to the logical address is stored but to a different physical memory location. Then, the controller 6 updates the logical-to-physical address conversion table to associate the logical address with the different physical memory location and to invalidate the previous user data.

The controller 6 includes, for example, a CPU 11, a NAND interface (NAND I/F) 12, a DRAM interface (DRAM I/F) 13, a host interface (host I/F) 14, and a compression device 15. The CPU 11, the NAND I/F 12, the DRAM I/F 13, the host I/F 14, and the compression device 15 are connected via, for example, a bus 10.

The CPU 11 is a processor configured to control the NAND I/F 12, the DRAM I/F 13, the host I/F 14, and the compression device 15. The CPU 11 performs various processes by executing the FW loaded from the NAND flash memory 4 in the DRAM 5. The FW is control programs that include instructions for causing the CPU 11 to execute the various processes. The CPU 11 executes, in addition to the above-described processes of FTL, command processes to process various commands from the host 2. The operation of the CPU 11 is controlled by the FW executed by the CPU 11. Note that part of or the entire FTL processes and command processes may be executed by a dedicated hardware in the controller 6.

The NAND I/F 12 electrically connects the controller 6 and the NAND flash memory 4. The NAND I/F 12 supports interface standards such as Toggle DDR and Open NAND Flash Interface (ONFI).

The NAND I/F 12 functions as a NAND control circuit configured to control the NAND flash memory 4. The NAND I/F 12 may be connected to multiple memory chips in the NAND flash memory 4 via multiple channels (Ch). By operating the memory chips in parallel, it is possible to broaden an access bandwidth between the controller 6 and the NAND flash memory 4.

The DRAM I/F 13 functions as a DRAM control circuit configured to control access to the DRAM 5.

The host I/F 14 is a circuit that functions as an interface that performs communication between the memory system 3 and the host 2. The host I/F 14 includes a circuit that receives various commands, for example, input/output (I/O) commands and various control commands from the host 2. The I/O commands may include a write command and a read command. The control commands may include an unmap command (trim command) and a format command. The host I/F 11 includes a circuit that transmits to the host 2 a response or data in accordance with a command.

The compression device 15 is an encoding unit that encodes data to be written into the NAND flash memory 4 to compress the data. For example, the CPU 11 inputs write data that is received from the host 2 in accordance with reception of a write command, to the compression device 15 as plain text data. The compression device 15 encodes the plain text data input from the CPU 11. In order to compress data, the compression device 15 includes, for example, a dictionary compressor 21.

The dictionary compressor 21 is a data compressor that performs dictionary coding on input data.

The dictionary coding is a coding scheme in which a data to be compressed is converted into a match distance and a match length by using a history buffer that stores data input in the past. The dictionary coding is also referred to as dictionary compression.

In the dictionary coding, the history buffer is searched to acquire past data that at least partially matches data to be compressed, and a match distance and a match length are obtained. The match distance is a distance from a position where the data to be compressed is to be stored to a position where the acquired past data is stored in the history buffer. The match length is the length of a matching portion between the acquired past data and the data to be compressed. The data to be compressed is converting into the match distance and the match length, thereby compressing the data. Note that in a case where past data that at least partially matches the data to be compressed is not stored in the history buffer, the dictionary compressor 21 outputs the data to be compressed as it is.

FIG. 2 is a view illustrating an example of the dictionary coding. In the example illustrated in FIG. 2, a data string input in the past " . . . cacabc" is stored in the history buffer. A current input data string is "caba".

In this case, two characters from the head of the current input data string "caba" match a data string "ca" that is stored at the sixth preceding position ahead from a position where the current input data string "caba" is stored in the history buffer. Further, three characters from the head of the current input data string "caba" match a data string "cab" that is stored at the fourth preceding position ahead from the position where the current input data string "caba" is stored in the history buffer.

In the dictionary coding, the current input data string "caba" is converted into a match distance and a match length that relatively refer to a longer matching data string in the history buffer.

Therefore, the current input data string "caba" is converted into a match distance "4" and a match length "3" relatively referring to the data string "cab" in the history buffer. The match distance "4" indicates a relative distance from the position where the current input data string "caba" is to be stored to the position where the data string "cab" is stored in the history buffer. The match length "3" indicates the length of a matching portion (i.e., the number of matching characters) between the current input data string "caba" and the data string "cab". Thus, in a case where the dictionary coding is performed on the current input data string "caba", the dictionary compressor 21 outputs, for example, (4, 3) that indicates a combination of the match distance and the match length.

FIG. 3 is a block diagram illustrating an example of a configuration of the compression device 15. The compression device 15 includes the dictionary compressor 21 and an entropy coding unit 22. Hereinafter, data input to the compression device 15 is referred to as input data 61.

The dictionary compressor 21 performs dictionary coding on the input data 61. The dictionary compressor 21 includes a plurality of hash calculation units 31, a hash table 32, a history buffer 33, a plurality of dictionary match comparison units 34, a dictionary search result update unit 35, and a dictionary match selection unit 36. The hash calculation units 31, the hash table 32, the history buffer 33, the dictionary match comparison units 34, and the dictionary search result update unit 35 are configured to process a plurality of substrings that are acquired from the input data 61, in parallel.

Hereinafter, a case where the plurality of substrings processed in parallel are M substrings will be exemplified. Here, M is an integer of two or more.

Each of the M substrings is a partial data string including a data string that is a part of the input data 61. More specifically, each of the M substrings has a first data length. The M substrings have respective head positions in the input data 61 that are sequentially shifted by a second data length. The first data length is, for example, 8 bytes. The second data length is shorter than the first data length. The second data length is, for example, 1 byte. 1-byte data corresponds to, for example, one character. The M substrings are arranged in order from a substring having a more forward head position in the input data 61. The i-th substring of the M substrings is referred to as an i-th substring. Here, i is any integer between 0 and (M−1).

In a case where the M substrings are processed in parallel, the dictionary compressor 21 includes, for example, M hash calculation units 31 and M dictionary match comparison units 34. The i-th hash calculation unit 31 of the M hash calculation units 31 corresponds to the i-th substring. The i-th hash calculation unit 31 is referred to as a hash calculation unit 31-$i$. The i-th dictionary match comparison unit 34 of the M dictionary match comparison units 34 corresponds to the i-th substring. The i-th dictionary match comparison unit 34 is referred to as a dictionary match comparison unit 34-$i$.

Hash Calculation Unit 31

Each of the M hash calculation units 31 acquires a substring from the input data 61 and calculates a hash value of the acquired substring. In the calculation of the hash value, one predetermined hash function and at least a part of the substring are used. Each of the M hash calculation units 31 sends the calculated hash value to the hash table 32.

More specifically, the i-th hash calculation unit 31-$i$ acquires the i-th substring from the input data 61. The hash calculation unit 31-$i$ calculates a hash value of the acquired i-th substring. The hash calculation unit 31-$i$ sends the calculated hash value to the hash table 32.

Hash Table 32

The hash table 32 is implemented with, for example, a volatile memory. The hash table 32 includes multiple storage areas. Each of the storage areas is capable of storing data associated with one hash value. The data associated with one hash value is, for example, data that identifies a storage area in the history buffer 33 that stores past input data. The data that identifies a storage area in the history buffer 33 is, for example, a combination of a bank and an address. Pieces of data respectively stored in the storage areas may be read in parallel.

A hash value of a substring functions as an address for identifying one of the storage areas in the hash table 32. The hash table 32 identifies one of the storage areas by using a hash value of a substring, which is calculated by each of the M hash calculation units 31, as an address.

In a case where a combination of a bank and an address of the history buffer 33 is stored in an identified storage area in the hash table 32, the combination of the bank and the address is read from the hash table 32. Then, a data read request that designates the read combination of the bank and the address is sent to the history buffer 33. The data read request requests the history buffer 33 to read data from a storage area that is identified by the designated combination of the bank and the address. Note that, in a case where a combination of a bank and an address of the history buffer 33 is not stored in the identified storage area in the hash table 32, a data read request to the history buffer 33 is not sent.

Hereinafter, a case where M data read requests are sent to the history buffer 33 in parallel by using hash values of the substrings that are calculated by the M hash calculation units 31, respectively, will be mainly described.

History Buffer 33

The history buffer 33 is implemented as, for example, an SRAM. The history buffer 33 may be implemented by using flip-flop circuits. The history buffer 33 is also referred to as a dictionary buffer. Here, a case where the history buffer 33 is implemented as the SRAM will be exemplified.

The SRAM includes multiple banks. Each of the banks is a storage area capable of storing data input to the dictionary compressor 21 in the past.

Each of the banks is accessed via corresponding read port and write port. A read port receives a data read request to a corresponding bank. A write port receives a data write request to a corresponding bank.

The smaller the number of read ports and write ports, the smaller the area of the SRAM. Therefore, for example, one read port and one write port are provided for one bank in the SRAM. Note that the SRAM may be provided with any number of read ports and any number of write ports for one bank. Hereinafter, a case where one read port and one write port are provided for one bank will be exemplified.

When collision between multiple data read requests that designate the same bank has occurred, the history buffer 33 accepts one data read request among the data read requests and rejects (i.e., does not accept) the remaining data read requests. More specifically, when one read port is provided for one bank and multiple data read requests that designate the bank are received in parallel, the history buffer 33 accepts one data read request among the data read requests and rejects the remaining data read requests. The history buffer 33 preferentially accepts, for example, a data read request corresponding to a substring that is located more forward in the input data 61.

The acceptance of a data read request by the history buffer 33 is controlled by, for example, an arbiter. The arbiter arbitrates multiple data read requests that designate the same bank. When receiving multiple data read requests that designate the same bank, the arbiter accepts a data read request corresponding to a substring located more forward in the input data 61 and rejects the other data read requests.

For example, in a case where a data read request corresponding to the zeroth substring and a data read request corresponding to the first substring designate the same bank, the arbiter accepts the data read request corresponding to the zeroth substring and rejects the data read request corresponding to the first substring. This is because the data read request corresponding to the first substring designates the same bank as the data read request corresponding to the zeroth substring, and a head position of the first substring in the input data 61 is behind a head position of the zeroth substring.

In the history buffer 33, a data string is read from a storage area that is identified by a combination of a bank and an address designated in an accepted data read request. More specifically, the data string is read from the designated bank by a specific timing in response to the accepted data read request. The specific timing is, for example, a timing at which a threshold time has elapsed since the history buffer 33 has received the data read request. The data string read from the designated bank is compared with a substring corresponding to the accepted data read request. A data string that is to be compared with a substring and has been read from the history buffer 33 is also referred to as a dictionary match candidate corresponding to the substring. A dictionary match candidate corresponding to a certain substring is sent to the dictionary match comparison unit 34 corresponding to the substring.

The history buffer 33 does not read a data string in accordance with each of the other data read requests that have been rejected. That is, for each of the data read requests that have been rejected, a corresponding data string cannot be read from a designated bank by the specific timing. Thus, a data string (that is, a dictionary match candidate) to be compared with a substring corresponding to each of the other data read requests that have been rejected is not sent to the dictionary match comparison unit 34.

Specifically, when having accepted a data read request corresponding to the i-th substring, the history buffer 33 reads a data string from a storage area that is identified by a combination of a bank and an address designated in the data read request. The read data string is a dictionary match candidate corresponding to the i-th substring. The dictionary match candidate corresponding to the i-th substring is sent to the i-th dictionary match comparison unit 34-$i$.

When the data read request corresponding to the i-th substring has been rejected, the history buffer 33 does not read the data string according to the data read request. Thus, the dictionary match candidate corresponding to the i-th substring is not sent to the i-th dictionary match comparison unit 34-$i$.

Dictionary Match Comparison Unit 34

Each of the M dictionary match comparison units 34 generates a dictionary search result of a corresponding substring. Each of the M dictionary match comparison units 34 acquires the corresponding substring from, for example, the input data 61. The substring may be acquired from the hash calculation unit 31 or the like. Each of the M dictionary match comparison units 34 sends the generated dictionary search result to the dictionary search result update unit 35.

The dictionary search result indicates a result of a search process of searching the history buffer 33 to obtain a data string that at least partially matches a substring. The dictionary search result includes (1) a dictionary match flag, (2) a dictionary match distance, and (3) a dictionary match length.

The dictionary match flag indicates whether or not it has been determined that a data string at least partially matching a corresponding substring is stored in the history buffer 33. The data string at least partially matching the substring is referred to as a dictionary match data string. In a case where it has been determined that the dictionary match data string is stored in the history buffer 33, the dictionary match flag indicates match. In a case where it has been determined that the dictionary match data string is not stored in the history buffer 33, the dictionary match flag indicates unmatch.

In the case where the dictionary match flag indicates match (that is, in the case where it has been determined that the dictionary match data string is stored in the history buffer 33), the dictionary match distance indicates a distance from a position in the history buffer 33 where the corresponding substring is to be stored to a position in the history buffer 33 where the dictionary match data string is stored. In the case where the dictionary match flag indicates unmatch (that is, in the case where it has been determined that the dictionary match data string is not stored in the history buffer 33), for example, no value is set as the dictionary match distance.

In the case where the dictionary match flag indicates match, the dictionary match length indicates a length of a matching portion between the corresponding substring and the dictionary match data string. In the case where the dictionary match flag indicates unmatch, for example, no value is set as the dictionary match length.

Note that a dictionary search result that includes a dictionary match flag indicating match, a dictionary match distance D, and a dictionary match length L is expressed by match (D, L). A dictionary search result that includes a dictionary match flag indicating unmatch is expressed by unmatch. A dictionary search result corresponding to the i-th substring is expressed by a dictionary search result ss[i].

Here, specific operations of the i-th dictionary match comparison unit 34-$i$ will be described for a case where a dictionary match candidate corresponding to the i-th substring has been sent from the history buffer 33 to the dictionary match comparison unit 34-$i$ and a case where the dictionary match candidate corresponding to the i-th substring was not sent from the history buffer 33 to the dictionary match comparison unit 34-$i$.

First, the case where the dictionary match candidate corresponding to the i-th substring has been sent from the history buffer 33 to the dictionary match comparison unit 34-$i$ will be described. In this case, the dictionary match comparison unit 34-$i$ compares the i-th substring with the dictionary match candidate and generates an i-th dictionary search result ss[i]. Specifically, when the i-th substring and the dictionary match candidate at least partially match each other, the dictionary match comparison unit 34-$i$ generates a dictionary search result ss[i] that includes a dictionary match flag indicating match, a dictionary match distance D, and the dictionary match length L, that is, generates match (D, L). When there is no matching portion between the i-th substring and the dictionary match candidate, the dictionary match comparison unit 34-$i$ generates a dictionary search result ss[i] that includes a dictionary match flag indicating unmatch, that is, generates unmatch. Then, the dictionary match comparison unit 34-$i$ sends the generated dictionary search result ss[i] to the dictionary search result update unit 35.

Next, the case where the dictionary match candidate corresponding to the i-th substring was not sent to the dictionary match comparison unit 34-$i$ will be described. In this case, the dictionary match comparison unit 34-$i$ generates a dictionary search result ss[i] that includes a dictionary match flag indicating unmatch. Then, the dictionary match comparison unit 34-$i$ sends the generated dictionary search result ss[i] to the dictionary search result update unit 35.

With the above configuration, the M dictionary match comparison units 34 send M dictionary search results ss[0] to ss[M-1] that correspond to the M substrings, respectively, to the dictionary search result update unit 35 in parallel.

Dictionary Search Result Update Unit 35

The dictionary search result update unit 35 generates M updated dictionary search results SS[0] to SS[M-1] by using the M dictionary search results ss[0] to ss[M-1]. The M updated dictionary search results SS[0] to SS[M-1] correspond to the M substrings, respectively. The dictionary search result update unit sends the generated M updated dictionary search results SS[0] to SS[M-1] to the dictionary match selection unit 36.

Each of the M updated dictionary search results SS[0] to SS[M-1] includes (1) a dictionary match flag, (2) a dictionary match distance, (3) a dictionary match length, and (4) an update flag A. The dictionary match flag, the dictionary match distance, and the dictionary match length are the same as those described above.

The update flag A indicates whether or not to update a corresponding dictionary search result. When the dictionary search result is to be updated, the update flag A indicates "true". When the dictionary search result is not to be updated, the update flag A indicates "false".

FIG. 4 is a block diagram illustrating a configuration example of the dictionary search result update unit 35. The M dictionary search results ss[0] to ss[M-1] are input to the dictionary search result update unit 35. The dictionary search result update unit 35 outputs the M updated dictionary search results SS[0] to SS[M-1] by using the input M dictionary search results ss[0] to ss[M-1].

Specifically, the dictionary search result update unit 35 outputs the dictionary search result ss[0] corresponding to the zeroth substring directly as the updated dictionary search result SS[0] corresponding to the zeroth substring.

In addition, the dictionary search result update unit 35 includes (M−1) substring result update units 41. The (M−1) substring result update units 41 correspond to (M−1) substrings, respectively, that are obtained by excluding the zeroth substring from the M substrings. Hereinafter, a substring result update unit 41 corresponding to the i-th substring is referred to as a substring result update unit 41-*i*.

The substring result update unit 41-*i* outputs an updated dictionary search result SS[i] corresponding to the i-th substring by using a dictionary search result ss[i] corresponding to the i-th substring and an updated dictionary search result SS[i-1] corresponding to the (i−1)-th substring. Specifically, the substring result update unit 41-*i* outputs the dictionary search result ss[i] directly as the updated dictionary search result SS[i], or outputs the dictionary search result ss[i] updated using the updated dictionary search result SS[i-1] as the updated dictionary search result SS[i].

FIG. 4 illustrates a case where M is 16. In this case, 16 dictionary search results ss[0] to ss[15] are input to the dictionary search result update unit 35. The dictionary search result update unit 35 outputs 16 updated dictionary search results SS[0] to SS[15] by using the 16 input dictionary search results ss[0] to ss[15]. The dictionary search result update unit 35 includes 15 substring result update units 41-1, 41-2, 41-3, . . . , and 41-15.

The substring result update unit 41-1 outputs the updated dictionary search result SS[1] of the first substring by using the dictionary search result ss[1] of the first substring and the updated dictionary search result SS[0] of the zeroth substring. The substring result update unit 41-2 outputs the updated dictionary search result SS[2] corresponding to the second substring by using the dictionary search result ss[2] of the second substring and the updated dictionary search result SS[1] of the first substring. The other substring result update units 41-3, . . . , and 41-15 operate in a similar manner.

With the above configuration, the dictionary search result update unit 35 sends the M updated dictionary search results SS[0] to SS[M-1] that correspond to the M substrings, respectively, to the dictionary match selection unit 36.

The description will continue returning to FIG. 3.

Dictionary Match Selection Unit 36

The dictionary match selection unit 36 selects at least one updated dictionary search result corresponding to the input data 61 from the M updated dictionary search results SS[0] to SS[M-1]. For example, the dictionary match selection unit 36 selects a corresponding updated dictionary search result in order from the head of the input data 611 so that the number of data strings in the input data 61 that correspond to updated dictionary search results each indicating unmatch is minimized and each data string in the input data 61 corresponds to an updated dictionary search result indicating a longer match length. Then, the dictionary match selection unit 36 sends data based on the selected updated dictionary search result to the entropy coding unit 22. The data based on the selected updated dictionary search result is referred to as dictionary encoded data 63. The dictionary encoded data 63 includes data of symbols (that is, a symbol string). Each of the symbols is, for example, any of a dictionary match distance symbol, a dictionary match length symbol, and a dictionary mismatch symbol.

Entropy Coding Unit 22

The entropy coding unit 22 performs entropy coding on the dictionary encoded data 63, thereby generating compressed data 64. The entropy coding is a variable-length coding scheme for dynamically generating a code table based on a frequency of occurence of each of symbols to be encoded. The entropy coding is defined by, for example, deflate or gzip. The code table includes information that indicates N types of symbols and N code words that are associated with the N types of symbols, respectively. In the entropy coding, a short code word is assigned to a symbol having a high frequency of occurence, and a long code word is assigned to a symbol having a low frequency of occurence. The entropy coding unit 22 converts an input symbol into a code word in accordance with such assignment. Accordingly, a code word obtained by the conversion is a variable-length code. Note that the symbol is, for example, data of a fixed length. The compressed data 64 generated by the entropy coding includes a code word obtained by converting each of the symbols included in the dictionary encoded data 63. The compressed data 64 may further include, as a header, data of the code table used for the entropy coding. The data of the code table is used to restore the code table (decode table) when the compressed data 64 is decompressed.

With the above configuration, the compression device 15 can generate the compressed data 64 obtained by compressing the input data 61. For example, in a case where the input data 61 is data requested to be written to the NAND flash memory 4 by the host 2, the CPU 11 writes the compressed data 64 into the NAND flash memory 4 via the NAND I/F 12.

The controller 6 may further include an ECC encoder and an ECC decoder. In this case, the ECC encoder generates a parity for error correction (ECC parity) for the compressed data 64 output from the entropy coding unit 22 and generates a code word having the generated ECC parity and the compressed data. Then, the CPU 11 is configured to write the code word into the NAND flash memory 4 via the NAND I/F 12. In other words, the CPU 11 is configured to write data based on the compressed data 64 output from the compression device 15 into the NAND flash memory 4 via the NAND I/F 12. Further, for example, in a case where a read command is received from the host 2 via the host I/F 14, the CPU 11 reads data based on the read command from the NAND flash memory 4 via the NAND I/F 12. The ECC decoder executes an error correction process on the read data. The read data on which the error correction process has been executed is input to a decompressor by the CPU 11 as compressed data, and the decompressor decompresses the input compressed data. The CPU 11 transmits the decompressed data to the host 2 in response to the read command from the host 2. That is, in response to the read command from the host 2, the CPU 11 is configured to decompress data based on data read from the NAND flash memory 4 and transmit the decompressed data to the host 2.

Note that part or all of the compression device 15 may be implemented as hardware such as a circuit, or may be implemented as programs (i.e., software) executed by at least one processor.

Next, a specific example of substrings 62, the hash table 32, and the history buffer 33 in the dictionary compressor 21 will be described with reference to FIGS. 5 to 7.

FIG. 5 illustrates (A) an example of the input data 61 and (B) an example of a plurality of substrings 62 acquired from the input data 61, in the dictionary compressor 21.

In the example illustrated in (A) of FIG. 5, the input data 61 includes a character string " . . . 0123456789abcdefghijk . . . ".

In the dictionary compressor 21, the substrings 62 are acquired from the input data 61. Each of the substrings 62 is a substring that is composed of a partial character string of the input data 61. Specifically, the substrings 62 that each have the first data length and have respective head positions in the input data 61 that are sequentially shifted by a second data length, are acquired from the input data 61.

In the example illustrated in (B) of FIG. 5, 14 substrings ss0 to ss13 are acquired from the input data 61. Here, the first data length is 8 bytes. The second data length is 1 byte (that is, one character). For example, the substring ss0 is composed of an 8-byte character string "01234567" of the input data 61 from the head. The substring ss1 is composed of an 8-byte character string "12345678" whose head position is shifted backward by 1 byte from the head of the input data 61. That is, in the input data 61, the head position of the substring ss1 is shifted backward by 1 byte from the head position of the substring ss0. Similarly, 8-byte character strings whose head positions are sequentially shifted by 1 byte are acquired from the input data 61 as the substrings ss2 to ss13.

FIG. 6 illustrates an example of a configuration of the hash table 32. The hash table 32 includes a plurality of storage areas. Each of the storage areas is identified by one corresponding hash value. Each of the storage areas is capable of storing data that indicates a combination of a bank and an address. The combination of the bank and the address functions as information that identifies a storage area in the history buffer 33 in which past input data is stored.

In the example illustrated in FIG. 6, a combination of a bank and an address "0, 4" is stored in a storage area that is identified by a hash value H (012 . . . ). Note that a combination of a bank and an address "x, y" indicates an address y in a bank x. A combination of a bank and an address "0, 5" is stored in a storage area that is identified by a hash value H (123 . . . ). A combination of a bank and an address "0, 6" is stored in a storage area that is identified by a hash value H (234 . . . ). A combination of a bank and an address "2, 4" is stored in a storage area that is identified by a hash value H (567 . . . ). A combination of a bank and an address "2, 5" is stored in a storage area that is identified by a hash value H (678 . . . ). A combination of a bank and an address "2, 6" is stored in a storage area that is identified by a hash value H (789 . . . ). A combination of a bank and an address "4, 4" is stored in a storage area that is identified by a hash value H (cde . . . ). A combination of a bank and an address "4, 5" is stored in a storage area that is identified by a hash value H (def . . . ).

In the following description, it is assumed that the hash values H illustrated in FIG. 6 match hash values of the substrings 62 illustrated in (B) of FIG. 5, respectively, as follows. The hash value H (012 . . . ) matches a hash value of the substring ss0. The hash value H (123 . . . ) matches a hash value of the substring ss1. The hash value H (234 . . . ) matches a hash value of the substring ss2. The hash value H (567 . . . ) matches a hash value of the substring ss5. The hash value H (678 . . . ) matches a hash value of the substring ss6. The hash value H (789 . . . ) matches a hash value of the substring ss7. The hash value H (cde . . . ) matches a hash value of the substring ss12. The hash value H (def . . . ) matches a hash value of the substring ss13.

FIG. 7 illustrates an example of data stored in the history buffer 33. The history buffer 33 includes a plurality of banks. Each of the banks is identified by, for example, a number assigned to the bank. A position in one bank is identified by an address. A position in a bank identified by an address indicates, for example, a storage area of a specific data unit. The specific data unit is, for example, a unit of 8 bytes. Therefore, when a number of a bank and an address are designated, a storage area of the designated address in the bank to which the designated number is assigned is identified.

In the example illustrated in FIG. 7, the history buffer 33 includes banks 0, 1, 2, 3, 4, and so on. Each of the banks stores data input to the dictionary compressor 21 in the past.

For example, a character string "01234567" is stored in a storage area whose address is 4 in the bank 0. A character string "12345678" is stored in a storage area whose address is 5 in the bank 0. A character string "23456 . . . " is stored in a storage area whose address is 6 in the bank 0.

A character string "56789abc" is stored in a storage area whose address is 4 in the bank 2. A character string "6789ab . . . " is stored in a storage area whose address is 5 in the bank 2. A character string "789ab . . . " is stored in a storage area whose address is 6 in the bank 2.

A character string "cdefxyzw" is stored in a storage area whose address is 4 in the bank 4. A character string "deff . . . " is stored in a storage area whose address is 5 in the bank 4.

Here, an example in which dictionary searches on the history buffer 33 illustrated in FIG. 7 are performed in parallel on the basis of the 14 substrings ss0 to ss13 illustrated in (B) of FIG. 5 and the hash table 32 illustrated in FIG. 6 to acquire dictionary search results and updated dictionary search results will be described. FIG. 8 illustrates an example of the dictionary search results and the updated dictionary search results acquired in the dictionary compressor 21.

Acquisition of Combination of Bank and Address from Hash Table 32

In the example illustrated in FIG. 8, it is assumed 14 combinations of a bank and an address are read in parallel from the hash table 32 on the basis of the hash values of the respective substrings ss0 to ss13. Each of the read 14 combinations of a bank and an address identifies a storage area in the history buffer 33. A combination of a bank and an address read from the hash table 32 on the basis of a hash value of a certain substring is also referred to as a combination of a bank and an address corresponding to a substring.

Specifically, in the hash table 32, the combination of the bank and the address "0, 4" is read from the storage area that is identified by the hash value of the substring ss0. The combination of the bank and the address "0, 5" is read from the storage area that is identified by the hash value of the substring ss1. The combination of the bank and the address "0, 6" is read from the storage area that is identified by the hash value of the substring ss2. A combination of a bank and an address is read from a storage area that is identified by a corresponding hash value similarly for each of the substrings ss3 and ss4. Note that it is assumed that the combination of the bank and the address corresponding to each of the substrings ss3 and ss4 also indicates the bank 0.

The combination of the bank and the address "2, 4" is read from the storage area that is identified by the hash value of the substring ss5. The combination of the bank and the address "2, 5" is read from the storage area that is identified by the hash value of the substring ss6. The combination of the bank and the address "2, 6" is read from the storage area that is identified by the hash value of the substring ss7. A combination of a bank and an address is read from a storage area that is identified by a corresponding hash value similarly for each of the substrings ss8 to ss11. Note that it is assumed that the combination of the bank and the address corresponding to each of the substrings ss8 to ss11 also indicates the bank 2.

The combination of the bank and the address "4, 4" is read from the storage area that is identified by the hash value of the substring ss12. The combination of the bank and the address "4, 5" is read from the storage area that is identified by the hash value of the substring ss13.

In this manner, the 14 combinations of a bank and an address are read from the hash table 32 on the basis of the hash values of the substrings ss0 to ss13, respectively. Then, data read requests that designate the 14 combinations of a bank and an address, respectively, are sent to the history buffer 33 in parallel.

Reading of Dictionary Match Candidate from History Buffer 33

The 14 data read requests sent from the hash table 32 to the history buffer 33 are arbitrated, for example, for each designated bank. When receiving multiple data read requests that designate the same bank, the history buffer 33 preferentially accepts a data read request corresponding to a substring that is located more forward in the input data 61.

Specifically, all the data read requests respectively corresponding to the substrings ss0 to ss4 designate the bank 0 of the history buffer 33. The history buffer 33 accepts the data read request corresponding to the substring ss0 that is located more forward in the input data 61 among the substrings ss0 to ss4. The data read request corresponding to the substring ss0 designates the combination of the bank and the address "0, 4". In the history buffer 33, a data string "01234567" is read from the storage area whose address is 4 in the bank 0 in accordance with the received data read request. The read data string "01234567" is sent to the dictionary match comparison unit 34 that corresponds to the substring ss0. The read data string "01234567" is a data string to be compared with the substring ss0. That is, the read data string "01234567" is a dictionary match candidate cs0 corresponding to the substring ss0.

The history buffer 33 does not accept (i.e., rejects) the other data read requests designating the bank 0, that is, the data read requests respectively corresponding to the substrings ss1 to ss4. Specifically, the history buffer 33 does not accept the data read request designating the combination of the bank and the address "0, 5" that corresponds to the substring ss1. Therefore, a dictionary match candidate cs1 corresponding to the substring ss1 is not sent to the dictionary match comparison unit 34 corresponding to the substring ss1. Further, the history buffer 33 does not accept the data read request designating the combination of the bank and the address "0, 6" corresponding to the substring ss2. Therefore, a dictionary match candidate cs2 corresponding to the substring ss2 is not sent to the dictionary match comparison unit 34 corresponding to the substring ss2. Similarly, the history buffer 33 does not accept the data read requests respectively corresponding to the substrings ss3 and ss4. Therefore, no dictionary match candidate is sent to the dictionary match comparison units 34 respectively corresponding to the substrings ss3 and ss4.

All the data read requests respectively corresponding to the substrings ss5 to ss11 designate the bank 2 of the history buffer 33. The history buffer 33 accepts the data read request corresponding to the substring ss5 that is located more forward in the input data 61 among the substrings ss5 to ss11. The data read request corresponding to the substring ss5 designates the combination of the bank and the address "2, 4". In the history buffer 33, a data string "56789abc" is read from the storage area whose address is 4 in the bank 2 in accordance with the accepted data read request. The read data string "56789abc" is sent to the dictionary match comparison unit 34 corresponding to the substring ss5. The read data string "56789abc" is a dictionary match candidate cs5 corresponding to the substring ss5.

The history buffer 33 does not accept the other data read requests designating the bank 2, that is, the data read requests respectively corresponding to the substrings ss6 to ss11. Specifically, the history buffer 33 does not accept the data read request designating the combination of the bank and the address "2, 5" that corresponds to the substring ss6. Therefore, a dictionary match candidate cs6 corresponding to the substring ss6 is not sent to the dictionary match comparison unit 34 corresponding to the substring ss6. Further, the history buffer 33 does not accept the data read request designating the combination of the bank and the address "2, 6" corresponding to the substring ss7. Therefore, a dictionary match candidate cs7 corresponding to the substring ss7 is not sent to the dictionary match comparison unit 34 corresponding to the substring ss7. Similarly, the history buffer 33 does not accept the data read requests respectively corresponding to the substrings ss8 to ss11. Therefore, no dictionary match candidate is sent to the dictionary match comparison units 34 respectively corresponding to the substrings ss8 to ss11.

All the data read requests respectively corresponding to the substrings ss12 and ss13 designate the bank 4 of the history buffer 33. The history buffer 33 accepts the data read request corresponding to the substring ss12 that is located more forward in the input data 61 between the substrings ss12 and ss13. The data read request corresponding to the substring ss12 designates the combination of the bank and the address "4, 4". In the history buffer 33, a data string "cdefxyzw" is read from the storage area whose address is 4 in the bank 4 in accordance with the received data read request. The read data string "cdefxyzw" is sent to the dictionary match comparison unit 34 corresponding to the substring ss12. The read data string "cdefxyzw" is a dictionary match candidate cs12 corresponding to the substring ss12.

The history buffer 33 does not accept the other data read request designating the bank 4, that is, the data read request corresponding to the substring ss13. Specifically, the history buffer 33 does not accept the data read request designating the combination of the bank and the address "4, 5" that corresponds to the substring ss13. Therefore, a dictionary match candidate cs13 corresponding to the substring ss13 is not sent to the dictionary match comparison unit 34 corresponding to the substring ss13.

Acquisition of Dictionary Search Result

Each of the 14 dictionary match comparison units 34 corresponds to one of the substrings ss0 to ss13. Each of the 14 dictionary match comparison units 34 generates a dictionary search result for the corresponding substring.

Specifically, the dictionary match comparison unit 34 corresponding to the substring ss0 compares the data string "01234567" of the substring ss0 with the data string "01234567" of the dictionary match candidate cs0. Then, match (D1, 8) is generated as a dictionary search result ss[0] of the substring ss0. The dictionary match distance "D1" indicates a distance from a position in the history buffer 33 where the substring ss0 is to be stored to a position in the history buffer 33 where the dictionary match candidate cs0 is stored. The dictionary match length "8" indicates the length of a matching portion between the substring ss0 and the dictionary match candidate cs0. Here, since the substring ss0 and the dictionary match candidate cs0 completely match each other, the dictionary match length "8" indicates eight characters corresponding to the whole of the data string.

The dictionary match candidate cs1 to be compared with the substring ss1 is not sent from the history buffer 33. Therefore, the dictionary match comparison unit 34 corresponding to the substring ss1 generates unmatch as a dictionary search result ss[1] of the substring ss1. As described above, the dictionary match candidate cs1 is stored in the same bank 0 as the dictionary match candidate cs0 corresponding to the substring ss0. Thus, the dictionary match candidate cs1 is not readable from the bank 0 by the specific timing.

Similarly to the dictionary search result ss[1] of the substring ss1, unmatch is generated as each of dictionary search results ss[2], ss[3], and ss[4] that correspond to the substrings ss2, ss3, and ss4, respectively.

The dictionary match comparison unit 34 corresponding to the substring ss5 compares the data string "56789abc" of the substring ss5 with the dictionary match candidate "56789abc". Then, the dictionary match comparison unit 34 corresponding to the substring ss5 generates match (D2, 8) as a dictionary search result ss[5] of the substring ss5. The dictionary match distance "D2" indicates a distance from a position in the history buffer 33 where the substring ss5 is to be stored to a position in the history buffer 33 where the dictionary match candidate cs5 is stored. The dictionary match length "8" indicates the length of a matching portion between the substring ss5 and the dictionary match candidate cs5.

The dictionary match candidate cs6 to be compared with the substring ss6 is not read from the history buffer 33. Therefore, the dictionary match comparison unit 34 corresponding to the substring ss6 generates unmatch as a dictionary search result ss[6] of the substring ss6. As described above, the dictionary match candidate cs6 is stored in the same bank 2 as the dictionary match candidate cs5 corresponding to the substring ss5. Thus, the dictionary match candidate cs6 is not readable from the bank 2 by the specific timing.

Similarly to the dictionary search result ss[6] of the substring ss6, unmatch is generated as each of dictionary search results ss[7] to ss[11] that correspond to the substrings ss7 to ss11, respectively.

The dictionary match comparison unit 34 corresponding to the substring ss12 compares a data string "cdefghij" of the substring ss12 with the dictionary match candidate "cdefxyzw". Then, the dictionary match comparison unit 34 corresponding to the substring ss12 generates match (D3, 4) as a dictionary search result ss[12] of the substring ss12. The dictionary match distance "D3" indicates a distance from a position in the history buffer 33 where the substring ss12 is to be stored to a position in the history buffer 33 where the dictionary match candidate cs12 is stored. The dictionary match length "4" indicates the length of a matching portion between the substring ss12 and the dictionary match candidate cs12. Here, the dictionary match length "4" indicates four characters from the head.

The dictionary match candidate cs13 to be compared with the substring ss13 is not read from the history buffer 33. The dictionary match comparison unit 34 corresponding to the substring ss13 generates unmatch as a dictionary search result ss[13] of the substring ss13. As described above, the dictionary match candidate cs13 is stored in the same bank 4 as the dictionary match candidate cs12 corresponding to the substring ss12. Thus, the dictionary match candidate cs13 is not readable from the bank 4 by the specific timing.

The dictionary search results ss[0] to ss[13] respectively corresponding to the substrings ss0 to ss13 are sent to the dictionary search result update unit 35.

Acquisition of Updated Dictionary Search Result

The dictionary search result update unit 35 generates updated dictionary search results SS[0] to SS[13] by using the dictionary search results ss[0] to ss[13]. The updated dictionary search results SS[0] to SS[13] correspond to the 14 substrings ss0 to ss13, respectively. The dictionary search result update unit 35 includes 13 substring result update units 41-1 to 41-13. The substring result update units 41-1 to 41-13 respectively correspond to the substrings ss1 to ss13 that are obtained by excluding the head substring ss0 from the substrings ss0 to ss13. The substring result update units 41-1 to 41-13 generate the updated dictionary search results SS[1] to SS[13], respectively.

Specifically, the dictionary search result update unit 35 generates match (D1, 8), which is the dictionary search result ss[0] of the substring ss0, directly as the updated dictionary search result SS[0].

The dictionary search result ss[1] of the substring ss1 is unmatch. A character string "1234567" that is the first seven characters of the substring ss1 matches a character string "1234567" that is seven characters beginning from the second character of the substring ss0. Therefore, the substring result update unit 41-1 corresponding to the substring ss1 generates match (D1, 7) as the updated dictionary search result SS[1] of the substring ss1 by utilizing the updated dictionary search result SS[0] of the substring ss0. In match (D1, 7), the dictionary match distance "D1" indicates a distance from a position in the history buffer 33 where the substring ss1 is to be stored to a position in the history buffer 33 where the second character from the head of the dictionary match candidate cs0 is stored. The dictionary match length "7" indicates the length of a matching portion between the character string of the substring ss1 and the character string from the second character of the dictionary match candidate cs0.

The dictionary search result ss[2] of the substring ss2 is unmatch. A character string "2345678" that is the first seven characters of the substring ss2 matches a character string "2345678" that is seven characters beginning from the second character of the substring ss1. Therefore, the substring result update unit 41-2 corresponding to the substring ss2 generates match (D1, 6) as the updated dictionary search result SS[2] of the substring ss2 by utilizing match (D1, 7) which is the updated dictionary search result SS[1] of the substring ss1. In match (D1, 6), the dictionary match distance "D1" indicates a distance from a position in the history buffer 33 where the substring ss2 is to be stored to a position in the history buffer 33 where the third character from the head of the dictionary match candidate cs0 is stored. The dictionary match length "6" indicates the length of a matching portion between the character string of the substring ss2 and the character string from the third character of the dictionary match candidate cs0.

Similarly, the substring result update unit 41-3 corresponding to the substring ss3 generates match (D1, 5) as the updated dictionary search result SS[3] of the substring ss3 by utilizing the updated dictionary search result SS[2] of the substring ss2. The substring result update unit 41-4 corresponding to the substring ss4 generates match (D1, 4) as the updated dictionary search result SS[4] of the substring ss4 by utilizing the updated dictionary search result SS[3] of the substring ss3.

The dictionary search result ss[5] of the substring ss5 is match (D2, 8). A character string "56789ab" that is the first seven characters of the substring ss5 matches a character string "56789ab" that is seven characters beginning from the second character of the substring ss4. Further, the updated dictionary search result SS[4] of the substring ss4 is match (D1, 4). In this case, the substring result update unit 41-5 corresponding to the substring ss5 generates match (D2, 8), which is the dictionary search result ss[5], directly as the updated dictionary search result SS[5]. If match (D1, 4), which is the updated dictionary search result SS[4] of the substring ss4, is used, the updated dictionary search result SS[5] becomes match (D1, 3). Therefore, the substring result update unit 41-5 generates match (D2, 8) of the dictionary search result ss[5] that has a longer match length, directly as the updated dictionary search result SS[5].

The dictionary search result ss[6] of the substring ss6 is unmatch. A character string "6789abc" that is the first seven characters of the substring ss6 matches a character string "6789abc" that is seven characters beginning from the second character of the substring ss5. Therefore, the substring result update unit 41-6 corresponding to the substring ss6 generates match (D2, 7) as the updated dictionary search result SS[6] of the substring ss6 by utilizing the updated dictionary search result SS[5] of the substring ss5. In match (D2, 7), the dictionary match distance "D2" indicates a distance from a position in the history buffer 33 where the substring ss6 is to be stored to a position in the history buffer 33 where the second character from the head of the dictionary match candidate cs5 is stored. The dictionary match length "7" indicates the length of a matching portion between the character string of the substring ss6 and the character string from the second character of the dictionary match candidate cs5.

Similarly, the substring result update unit 41-7 corresponding to the substring ss7 generates match (D2, 6) as the updated dictionary search result SS[7] of the substring ss7 by utilizing the updated dictionary search result SS[6] of the substring ss6. The substring result update unit 41-8 corresponding to the substring ss8 generates match (D2, 5) as the updated dictionary search result SS[8] of the substring ss8 by utilizing the updated dictionary search result SS[7] of the substring ss7. The substring result update unit 41-9 corresponding to the substring ss9 generates match (D2, 4) as the updated dictionary search result SS[9] of the substring ss9 by utilizing the updated dictionary search result SS[8] of the substring ss8. The substring result update unit 41-10 corresponding to the substring ss10 generates match (D2, 3) as the updated dictionary search result SS[10] of the substring ss10 by utilizing the updated dictionary search result SS[9] of the substring ss9. The substring result update unit 41-11 corresponding to the substring ss11 generates match (D2, 2) as the updated dictionary search result SS[10] of the substring ss10 by utilizing the updated dictionary search result SS[11] of the substring ss11. Note that in a case where the dictionary match length of the updated dictionary search result SS[11] is less than a threshold (for example, three), the substring result update unit 41-11 may generate unmatch of the dictionary search result ss[11] directly as the updated dictionary search result SS[11]. This is because the compression efficiency is better when the corresponding character string is output as it is than when dictionary coding is performed on the dictionary match length less than the threshold.

The dictionary search result ss[12] of the substring ss12 is match (D3, 4). A character string "cdefghi" that is the first seven characters of the substring ss12 matches a character string "cdefghi" that is seven characters beginning from the second character of the substring ss11. Further, the updated dictionary search result SS[11] of the substring ss11 is match (D2, 2). In this case, the substring result update unit 41-12 corresponding to the substring ss12 generates match (D3, 4), which is the dictionary search result ss[12], directly as the updated dictionary search result SS[12]. If match (D2, 2), which is the updated dictionary search result SS[11] of the substring ss11, is used, the updated dictionary search result SS[12] becomes match (D2, 1). Therefore, the substring result update unit 41-12 generates match (D3, 4) of the dictionary search result ss[12] that has a longer match length, directly as the updated dictionary search result SS[12].

The dictionary search result ss[13] of the substring ss13 is unmatch. A character string "defghij" that is the first seven characters of the substring ss13 matches a character string "defghij" that is seven characters beginning from the second character of the substring ss12. Therefore, the substring result update unit 41-13 corresponding to the substring ss13 generates match (D3, 3) as the updated dictionary search result SS[13] of the substring ss13 by utilizing the updated dictionary search result SS[12] of the substring ss12. In match (D3, 3), the dictionary match distance "D3" indicates a distance from a position in the history buffer 33 where the substring ss13 is to be stored to a position in the history buffer 33 where the second character from the head of the dictionary match candidate cs12 is stored. The dictionary match length "3" indicates the length of a matching portion between the character string of the substring ss13 and the character string from the second character of the dictionary match candidate cs12.

As described above, the updated dictionary search results SS[0] to SS[13] respectively corresponding to the substrings ss0 to ss13 are generated. In a case where the dictionary search result ss[i] of the i-th substring is unmatch, the dictionary search result update unit 35 (more specifically, the substring result update unit 41-*i*) may generate the updated dictionary search result SS[i] of the i-th substring by using, for example, the updated dictionary search result SS[i-1] of the (i−1)-th substring. When the updated dictionary search result SS[i-1] is match (D, L), the updated dictionary search result SS[i] is match (D, L-1). Therefore, the dictionary search result update unit 35 can update the dictionary search result ss[i] that is unmatch with the updated dictionary search result SS[i] that is match (D, L-1).

Figure 9:
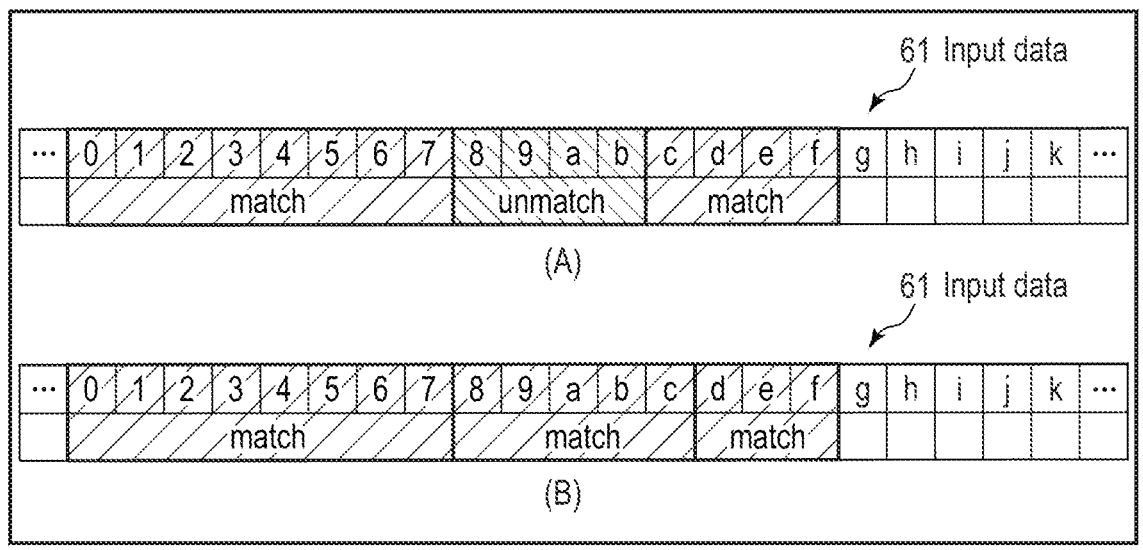
FIG. 9 is a view illustrating (A) an example of data compressed by using the dictionary search results and (B) an example of data compressed by using the updated dictionary search results, in the dictionary compressor according to the first embodiment.

FIG. 9 illustrates (A) an example of data compressed with dictionary search results and (B) an example of data compressed with updated dictionary search results, in the dictionary compressor 21. Here, the 14 dictionary search results ss[0] to ss[13] described above with reference to FIG. 8 are used in the example illustrated in (A) of FIG. 9. The 14 updated dictionary search results SS[0] to SS[13] described above with reference to FIG. 8 are used in the example illustrated in (B) of FIG. 9.

The dictionary search results ss[0] to ss[13] include dictionary search results each indicating unmatch. This is because since the data read requests that designate the same bank have been sent in parallel to the history buffer 33, only a data string (dictionary match candidate) corresponding to one data read request among the data read requests can be read from the bank.

On the other hand, the updated dictionary search results SS[0] to SS[13] do not include any dictionary search result indicating unmatch. That is, all the updated dictionary search results SS[0] to SS[13] are dictionary search results each indicating match.

In the example illustrated in (A) of FIG. 9, the input data 61 is compressed by using match (D1, 8) which is the dictionary search result ss[0] corresponding to the substring ss0 "01234567", and match (D3, 4) which is the dictionary search result ss[12] corresponding to the substring ss12 "cdefghij". The dictionary search result corresponding to a character string "89ab" indicates unmatch. Therefore, the character string "89ab" is output as it is without being compressed.

In the example illustrated in (B) of FIG. 9, the input data 61 is compressed by using match (D1, 8) which is the updated dictionary search result SS[0] corresponding to the substring ss0 "01234567", match (D2, 5) which is the updated dictionary search result SS[8] corresponding to the substring ss8 "89abcdef", and match (D3, 3) which is the updated dictionary search result SS[13] corresponding to the substring ss13 "defghijk". In this manner, more character strings are converted into combinations of a match distance and a match length in the example illustrated in (B) of FIG. 9 using the updated dictionary search results SS[0] to SS[13] as compared with the example illustrated in (A) of FIG. 9 using the dictionary search results ss[0] to ss[13]. Therefore, the compression efficiency of the input data 61 can be improved in the case of using the updated dictionary search results SS[0] to SS[13] as compared with the case of using the dictionary search results ss[0] to ss[13].

Here, an operation of the substring result update unit 41-$i$ in the dictionary search result update unit 35 will be described more specifically. FIG. 10 illustrates an example of the operation of the substring result update unit 41-$i$ expressed by a program. The substring result update unit 41-$i$ performs the following operations (A1) to (A4).

(A1) The substring result update unit 41-$i$ calculates, as the update flag A of the updated dictionary search result SS[i], a logical AND of (a) a value indicating whether or not a dictionary match flag of the updated dictionary search result SS[i-1] is match, (b) a value indicating whether or not a dictionary match flag of the dictionary search result ss[i] is unmatch, and (c) a value indicating whether or not a dictionary match length of the updated dictionary search result SS[i-1] is equal to or greater than a threshold. Each of (a) the value indicating whether or not the dictionary match flag of the updated dictionary search result SS[i-1] is match, (b) the value indicating whether or not the dictionary match flag of the dictionary search result ss[i] is unmatch, and (c) the value indicating whether or not the dictionary match length of the updated dictionary search result SS[i-1] is equal to or greater than the threshold is, for example, either true or false. Specifically, when the dictionary match flag of the updated dictionary search result SS[i-1] is match, (a) the value indicating whether or not the dictionary match flag of the updated dictionary search result SS[i-1] is match is true. When the dictionary match flag of the updated dictionary search result SS[i-1] is unmatch, (a) the value indicating whether or not the dictionary match flag of the updated dictionary search result SS[i-1] is match is false. The same also applies for (b) the value indicating whether or not the dictionary match flag of the dictionary search result ss[i] is unmatch, and (c) the value indicating whether or not the dictionary match length of the updated dictionary search result SS[i-1] is equal to or greater than the threshold.

(A2) If the update flag A of the updated dictionary search result SS[i] is true, the substring result update unit 41-$i$ sets the dictionary match flag of the updated dictionary search result SS[i-1] as the dictionary match flag of the updated dictionary search result SS[i]. If the update flag A of the updated dictionary search result SS[i] is false, the substring result update unit 41-$i$ sets the dictionary match flag of the dictionary search result ss[i] as the dictionary match flag of the updated dictionary search result SS[i].

(A3) If the update flag A of the updated dictionary search result SS[i] is true, the substring result update unit 41-$i$ sets the dictionary match distance of the updated dictionary search result SS[i-1] as the dictionary match distance of the updated dictionary search result SS[i]. If the update flag A of the updated dictionary search result SS[i] is false, the substring result update unit 41-$i$ sets the dictionary match distance of the dictionary search result ss[i] as the dictionary match distance of the updated dictionary search result SS[i].

(A4) If the update flag A of the updated dictionary search result SS[i] is true, the substring result update unit 41-$i$ sets a value obtained by subtracting one from the dictionary match length of the updated dictionary search result SS[i-1] as the dictionary match length of the updated dictionary search result SS[i]. If the update flag A of the updated dictionary search result SS[i] is false, the substring result update unit 41-$i$ sets the dictionary match length of the dictionary search result ss[i] as the dictionary match length of the updated dictionary search result SS[i].

Through the above operations, the substring result update unit 41-$i$ can acquire the updated dictionary search result SS[i] by using the dictionary search result ss[i] and the updated dictionary search result SS[i-1] depending on the calculation result of the update flag A.

Specifically, if the update flag A is true, the substring result update unit 41-$i$ acquires the updated dictionary search result SS[i] by using the updated dictionary search result SS[i-1]. In other words, the substring result update unit 41-$i$ updates the dictionary search result ss[i] with the updated dictionary search result SS[i-1], thereby acquiring the updated dictionary search result SS[i].

In contrast, if the update flag A is false, the substring result update unit 41-$i$ acquires the updated dictionary search result SS[i] by using the dictionary search result ss[i]. In other words, the substring result update unit 41-$i$ sets the dictionary search result ss[i] directly as the updated dictionary search result SS[i].

FIG. 11 illustrates an example of the updated dictionary search results acquired by the dictionary search result update unit 35. Here, a case where the dictionary search result ss[i] of each of the four substrings ss0, ss1, ss2, and ss3 is input to the dictionary search result update unit 35 will be exemplified. It is assumed that the threshold of a dictionary match length is set to three. The dictionary search result ss[0] corresponding to the substring ss0 is assumed as match (D1, 8). The dictionary search result ss[1] corresponding to the substring ss1 is assumed as unmatch. The dictionary search result ss[2] corresponding to the substring ss2 is assumed as unmatch. The dictionary search result ss[3] corresponding to the substring ss3 is assumed as unmatch.

The dictionary search result update unit 35 outputs the dictionary search result ss[0] corresponding to the head substring ss0 directly as an updated dictionary search result SS[0] corresponding to the substring ss0. Therefore, match (D1, 8) is set as the updated dictionary search result SS[0].

A character string "1234567" that is the first seven characters of the substring ss1 matches a character string "1234567" that is seven characters beginning from the second character of the substring ss0. Therefore, the substring result update unit 40-1 may set an updated dictionary search result SS[1] corresponding to the substring ss1 by using the updated dictionary search result SS[0]. Specifically, since the dictionary match flag of the updated dictionary search result SS[0] is match, the dictionary match flag of the dictionary search result ss[1] is unmatch, and the dictionary match length of the updated dictionary search result SS[0] is equal to or greater than the threshold (that is, since the update flag A of the updated dictionary search result SS[1] is true), the substring result update unit 40-1 sets the updated dictionary search result SS[1] by using the updated dictionary search result SS[0]. As a result, match (D1, 7) is set as the updated dictionary search result SS[1].

A character string "2345678" that is the first seven characters of the substring ss2 matches a character string "2345678" that is seven characters beginning from the second character of the substring ss1. Therefore, the substring result update unit 40-2 may set an updated dictionary search result SS[2] corresponding to the substring ss2 by using the updated dictionary search result SS[1]. Specifically, since the dictionary match flag of the updated dictionary search result SS[1] is match, the dictionary match flag of the dictionary search result ss[2] is unmatch, and the dictionary match length of the updated dictionary search result SS[1] is equal to or greater than the threshold (that is, the update flag A of the updated dictionary search result SS[2] is true), the substring result update unit 40-2 sets the updated dictionary search result SS[2] by using the updated dictionary search result SS[1]. As a result, match (D1, 6) is set as the updated dictionary search result SS[2].

A character string "3456789" that is the first seven characters of the substring ss3 matches a character string "3456789" that is seven characters beginning from the second character of the substring ss2. Therefore, the substring result update unit 40-3 may set an updated dictionary search result SS[3] corresponding to the substring ss3 by using the updated dictionary search result SS[2]. Specifically, since the dictionary match flag of the updated dictionary search result SS[2] is match, the dictionary match flag of the dictionary search result ss[3] is unmatch, and the dictionary match length of the updated dictionary search result SS[2] is equal to or greater than the threshold (that is, the update flag A of the updated dictionary search result SS[3] is true), the substring result update unit 40-3 sets the updated dictionary search result SS[3] by using the updated dictionary search result SS[2]. As a result, match (D1, 5) is set as the updated dictionary search result SS[3].

The dictionary compressor 21 can improve the compression efficiency of the input data 61 by using the updated dictionary search results SS[0] to SS[3] instead of the dictionary search results ss[0] to ss[3]. Further, the updated dictionary search result SS[i] of the i-th substring is obtained by using either the dictionary search result ss[i] or the updated dictionary search result SS[i-1] corresponding to the (i-1)-th substring. Therefore, the dictionary compressor 21 can improve the compression efficiency of the input data 61 while maintaining a high throughput without changing hardware resources of the history buffer 33 (for example, the number of read ports for each bank).

Next, an example of the procedures of processes executed in the compression device 15 will be described with reference to FIGS. 12 to 14.

FIG. 12 is a flowchart illustrating an example of the procedure of an encoding process executed in the compression device 15. The encoding process is a process of performing dictionary coding and entropy coding on the input data 61. The compression device 15 executes the encoding process in response to receiving the input data 61.

First, the dictionary compressor 21 of the compression device 15 performs dictionary search processes on respective M substrings in parallel that are acquired from the input data 61 (step S101). Each dictionary search process is a process of searching the history buffer 33 on the basis of a substring and acquiring a dictionary search result. A specific procedure of each dictionary search process will be described later with reference to a flowchart of FIG. 13.

The dictionary compressor 21 performs search result update processes on the respective acquired M dictionary search results in parallel (step S102). Each search result update process is a process of acquiring an updated dictionary search result by using a dictionary search result. In each search result update process, the dictionary search result is updated when a specific condition is satisfied. A specific procedure of each search result update process will be described later with reference to a flowchart of FIG. 14.

The dictionary compressor 21 selects at least one updated dictionary search result that corresponds to the input data 61, from M updated dictionary search results acquired as results of the search result update processes (step S103). For example, the dictionary compressor 21 selects a corresponding updated dictionary search result from the M updated dictionary search results in order from the head of the input data 61 so that the number of data strings in the input data 61 that correspond to updated dictionary search results each indicating unmatch is minimized and each data string in the input data 61 corresponds to an updated dictionary search result indicating a longer match length. Then, the dictionary compressor 21 sends data based on the selected updated dictionary search result (that is, the dictionary encoded data 63) to the entropy coding unit 22 (step S104).

Next, the dictionary compressor 21 determines whether or not the dictionary coding on the input data 61 has been completed (step S105). When the dictionary coding on the input data 61 has not been completed (No in step S105), the process performed by the dictionary compressor 21 returns to step S101. That is, the dictionary compressor 21 further performs dictionary coding on data that is subsequent to the data for which the dictionary coding has been completed, in the input data 61.

When the dictionary coding on the input data 61 has been completed (Yes in step S105), the entropy coding unit 22 performs entropy coding on the dictionary encoded data 63 (step S106), and ends the encoding process. The entropy coding unit 22 outputs the compressed data 64 obtained by the entropy coding.

Through the above encoding process, the compression device 15 can generate the compressed data 64 obtained by compressing the input data 61.

Figure 13:
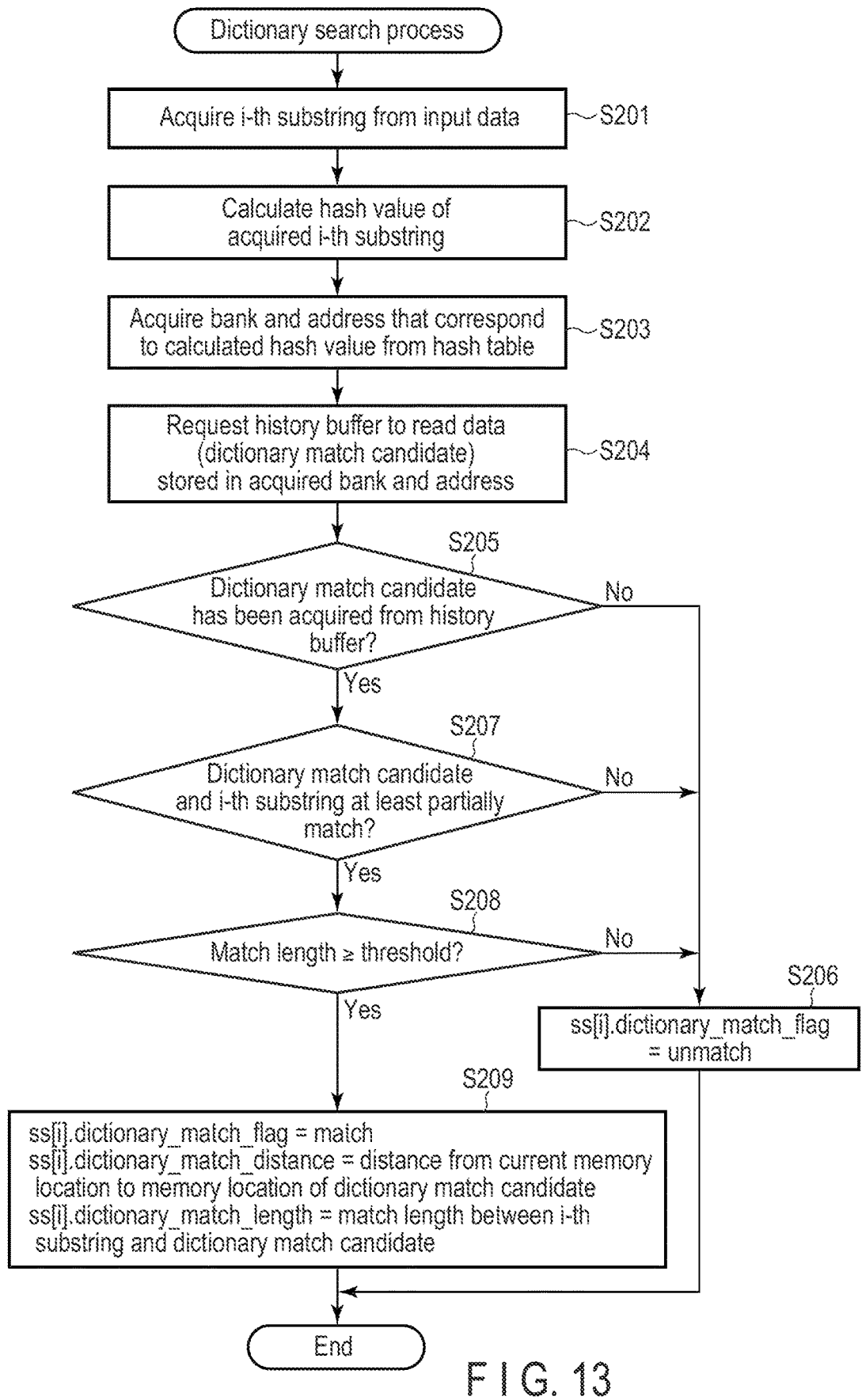
FIG. 13 is a flowchart illustrating an example of the procedure of a dictionary search process executed in the dictionary compressor according to the first embodiment.

FIG. 13 is the flowchart illustrating an example of the procedure of the dictionary search process executed in the dictionary compressor 21. The dictionary search process is a process of searching the history buffer 33 on the basis of one substring and acquiring a search result. The dictionary search process corresponds to step S101 of the encoding process described above with reference to FIG. 12. Here, the dictionary search process performed on an i-th substring of the M substrings that are processed in parallel will be exemplified.

First, the hash calculation unit 31 of the dictionary compressor 21 acquires the i-th substring from the input data 61 (step S201). For example, the hash calculation unit 31 acquires the i-th substring having the first data length from a head position that is shifted i times by a second data length in the input data 61. Then, the hash calculation unit 31 calculates a hash value of the acquired i-th substring (step S202). The calculated hash value of the i-th substring is sent to the hash table 32.

The hash table 32 acquires a bank and an address that correspond to the hash value of the i-th substring (step S203). The acquired bank and address indicate a position in the history buffer 33 in which data for which the same hash value has been calculated (that is, past input data) is stored.

Next, the history buffer 33 is requested to read data stored in the acquired bank and address (step S204). For example, a data read request that designates the acquired bank and address is sent to the history buffer 33, thereby requesting the history buffer 33 to read the data stored in the bank and the address. The data whose reading is requested is a dictionary match candidate. When the dictionary match candidate has been read by a specific timing, the dictionary match candidate is sent from the history buffer 33 to the dictionary match comparison unit 34. When the dictionary match candidate has not been read by the specific timing, for example, no data is sent from the history buffer 33 to the dictionary match comparison unit 34.

The dictionary match comparison unit 34 determines whether or not the dictionary match candidate has been acquired from the history buffer 33 (step S205). That is, the dictionary match comparison unit 34 determines whether or not the dictionary match candidate has been read from the history buffer 33 by the specific timing.

When the dictionary match candidate has not been acquired from the history buffer 33 (No in step S205), the dictionary match comparison unit 34 generates, for the i-th substring, a dictionary search result ss[i] in which unmatch is set as a dictionary match flag (step S206). This is because the dictionary match candidate to be compared with the i-th substring has not been acquired. Then, the dictionary match comparison unit 34 ends the dictionary search process.

When the dictionary match candidate has been acquired from the history buffer 33 (Yes in step S205), the dictionary match comparison unit 34 determines whether or not the i-th substring and the dictionary match candidate at least partially match each other (step S207).

When there is no matching portion between the i-th substring and the dictionary match candidate (No in step S207), the dictionary match comparison unit 34 generates, for the i-th substring, a dictionary search result ss[i] in which unmatch is set as the dictionary match flag (step S206), and ends the dictionary search process.

When the i-th substring and the dictionary match candidate at least partially match each other (Yes in step S207), the dictionary match comparison unit 34 determines whether or not a match length between the i-th substring and the dictionary match candidate is equal to or greater than a threshold (step S208).

When the match length is less than the threshold (No in step S208), the dictionary match comparison unit 34 generates, for the i-th substring, the dictionary search result ss[i] in which unmatch is set as the dictionary match flag (step S206), and ends the dictionary search process.

When the match length is equal to or greater than the threshold (Yes in step S208), the dictionary match comparison unit 34 (1) sets match as the dictionary match flag, (2) sets, as a dictionary match distance, a distance from a position in the history buffer 33 where the i-th substring is to be stored (that is, a current storage position) to a position in the history buffer 33 where the dictionary match candidate is stored, and (3) sets the match length between the i-th substring and the dictionary match candidate as a dictionary match length, in the dictionary search result ss[i] corresponding to the i-th substring (step S209), and ends the dictionary search process.

Through the above dictionary search process, the dictionary match comparison unit 34 can search the history buffer 33 on the basis of the i-th substring and obtain the dictionary search result ss[i].

Figure 14:
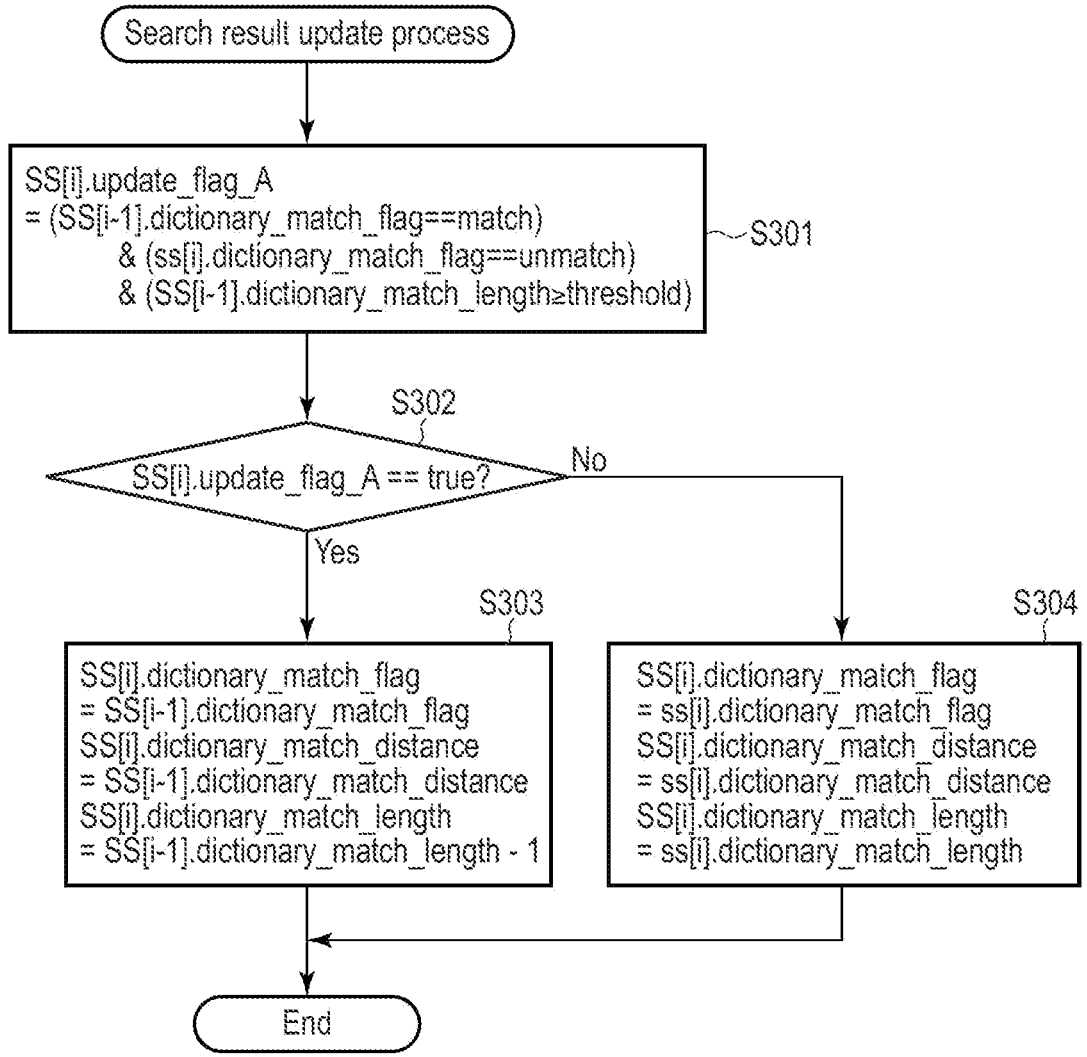
FIG. 14 is a flowchart illustrating an example of the procedure of a search result update process executed in the dictionary compressor according to the first embodiment.

FIG. 14 is the flowchart illustrating an example of the procedure of the search result update process executed in the dictionary compressor 21. The search result update process is a process of acquiring an updated dictionary search result by using a dictionary search result generated by the dictionary match comparison unit 34. The search result update process corresponds to step S102 of the encoding process described above with reference to FIG. 12.

Here, a case where the search result update process is performed on an i-th dictionary search result ss[i] of the M dictionary search results ss[0] to ss[M-1] to acquire an updated dictionary search result SS[i] will be exemplified. The dictionary search result ss[i] and the updated dictionary search result SS[i] correspond to the i-th substring of the M substrings that are processed in parallel.

Note that in the search result update process for acquiring the updated dictionary search result SS[i], the dictionary search result ss[i] and the (i-k)-th updated dictionary search result SS[i-k] are used. Therefore, the search result update process for acquiring the updated dictionary search result SS[i] is performed after the search result update process for acquiring the updated dictionary search result SS[i-k] has been completed. In a case where i is equal to or less than (the first data length −1), k is any integer between one and i. In a case where i is greater than (the first data length −1), k is any integer between one and (the first data length −1). In a case where i is zero and k is one, there is no updated dictionary search result SS[i-k], and thus, the dictionary search result ss[0] is used directly as the updated dictionary search result SS[0]. In the following description of the search result update process, a case where i is an integer of one or more and k is one will be exemplified.

First, the dictionary search result update unit 35 of the dictionary compressor 21 sets, as the update flag A of the updated dictionary search result SS[i] corresponding to the i-th substring, a logical AND of (a) a value indicating whether or not the dictionary match flag of the updated dictionary search result SS[i-1] corresponding to the (i−1)-th substring is match, (b) a value indicating whether or not the dictionary match flag of the dictionary search result ss[i] is unmatch, and (c) a value indicating whether or not the dictionary match length of the updated dictionary search result SS[i-1] is equal to or greater than a threshold (step S301).

The dictionary search result update unit 35 determines whether or not the set update flag A of the updated dictionary search result SS[i] is true (step S302).

When the update flag A of the updated dictionary search result SS[i] is true (Yes in step S302), the dictionary search result update unit 35 (1) sets the dictionary match flag of the updated dictionary search result SS[i-1] as the dictionary match flag of the updated dictionary search result SS[i], (2) sets the dictionary match distance of the updated dictionary search result SS[i-1] as the dictionary match distance of the updated dictionary search result SS[i], and (3) sets a value obtained by subtracting one from the dictionary match length of the updated dictionary search result SS[i-1] as the dictionary match length of the updated dictionary search result SS[i] (step S303), and ends the search result update process. The update flag A being true indicates that the dictionary match flag of the updated dictionary search result SS[i-1] is match, the dictionary match flag of the dictionary search result ss[i] is unmatch, and the dictionary match length of the updated dictionary search result SS[i-1] is equal to or greater than the threshold. In this case, the dictionary search result update unit 35 updates the dictionary search result ss[i], which is unmatch, with the updated dictionary search result SS[i-1], thereby acquiring the updated dictionary search result SS[i]. That is, the dictionary search result update unit 35 sets the dictionary match flag, the dictionary match distance, and the dictionary match length of the updated dictionary search result SS[i] by using the updated dictionary search result SS[i-1]. This increases the possibility that a data string in the input data 61 is converted into a combination of a dictionary match distance and a dictionary match length. Therefore, the compression efficiency of the input data 61 can be improved.

When the update flag A of the updated dictionary search result SS[i] is false (No in step S302), the dictionary search result update unit 35 (1) sets the dictionary match flag of the dictionary search result ss[i] as the dictionary match flag of the updated dictionary search result SS[i], (2) sets the dictionary match distance of the dictionary search result ss[i] as the dictionary match distance of the updated dictionary search result SS[i], and (3) sets the dictionary match length of the dictionary search result ss[i] as the dictionary match length of the updated dictionary search result SS[i] (step S303). That is, the dictionary search result update unit 35 sets the dictionary match flag, the dictionary match distance, and the dictionary match length of the dictionary search result ss[i] directly as the dictionary match flag, the dictionary match distance, and the dictionary match length of the updated dictionary search result SS[i], respectively. Then, the dictionary search result update unit 35 ends the search result update process.

Through the above search result update process, the dictionary search result update unit 35 can acquire the updated dictionary search result SS[i] for the i-th substring by using the dictionary search result ss[i] and the updated dictionary search result SS[i-k]. For example, when the dictionary search result ss[i] of the i-th substring is unmatch, the dictionary search result update unit 35 may generate the updated dictionary search result SS[i] of the i-th substring by using the updated dictionary search result SS[i-k] of the preceding (i-k)-th substring. When the updated dictionary search result SS[i-k] is match (D, L), the updated dictionary search result SS[i] is match (D, L-k). Therefore, the dictionary search result update unit 35 can update the dictionary search result ss[i] that is unmatch with the updated dictionary search result SS[i] that is match (D, L-k).

Since the updated dictionary search results obtained by such updating are used, the dictionary compressor 21 can improve the compression efficiency of the input data 61.

Second Embodiment

In the dictionary compressor 21 according to the first embodiment, the update flag A is used to determine whether or not to update the dictionary search result. The dictionary compressor 21 according to the first embodiment updates the dictionary search result ss[i] of the i-th substring when the update flag A indicates that: the dictionary match flag of the updated dictionary search result SS[i-1] is match; the dictionary match flag of the dictionary search result ss[i] is unmatch; and the dictionary match length of the updated dictionary search result SS[i-1] is equal to or greater than a threshold.

In contrast, in a dictionary compressor 21 according to a second embodiment, an update flag B is further used in addition to the update flag A to determine whether or not to update a dictionary search result. The dictionary compressor 21 according to the second embodiment also updates the dictionary search result ss[i] of the i-th substring when the update flag B indicates that: both the dictionary match flag of the updated dictionary search result SS[i-1] and the dictionary match flag of the dictionary search result ss[i] are match, and a value obtained by subtracting one from the dictionary match length of the updated dictionary search result SS[i-1] is greater than the dictionary match length of the dictionary search result ss[i].

A configuration of a memory system 3 including the dictionary compressor 21 according to the second embodiment is similar to that of the memory system 3 including the dictionary compressor 21 according to the first embodiment. The second embodiment is different from the first embodiment in terms of the procedure of a process executed by the substring result update unit 41 of the dictionary search result update unit 35. Hereinafter, differences from the first embodiment will be mainly described.

FIG. 15 illustrates an example of an operation of the substring result update unit 41-$i$ expressed by a program. The substring result update unit 41-$i$ performs the following operations (B1) to (B5).

(B1) The substring result update unit 41-$i$ calculates the update flag A of the updated dictionary search result SS[i] in the same manner as in (A1) described above with reference to FIG. 10.

(B2) The substring result update unit 41-$i$ calculates, as the update flag B of the updated dictionary search result SS[i], a logical AND of (a) a value indicating whether or not the dictionary match flag of the updated dictionary search result SS[i-1] is match, (b) a value indicating whether or not the dictionary match flag of the dictionary search result ss[i] is match, and (c) a value indicating whether or not a value obtained by subtracting one from the dictionary match length of the updated dictionary search result SS[i-1] is greater than the dictionary match length of the dictionary search result ss[i].

(B3) The substring result update unit 41-$i$ sets either the dictionary match flag of the updated dictionary search result SS[i-1] or the dictionary match flag of the dictionary search result ss[i] as the dictionary match flag of the updated dictionary search result SS[i] in the same manner as in (A3) described above with reference to FIG. 10.

(B4) When at least one of the update flag A and the update flag B of the updated dictionary search result SS[i] is true, the substring result update unit 41-$i$ sets the dictionary match distance of the updated dictionary search result SS[i-1] as the dictionary match distance of the updated dictionary search result SS[i]. When both the update flag A and the update flag B of the updated dictionary search result SS[i] are false, the substring result update unit 41-$i$ sets the dictionary match distance of the dictionary search result ss[i] as the dictionary match distance of the updated dictionary search result SS[i].

(B5) When at least one of the update flag A and the update flag B of the updated dictionary search result SS[i] is true, the substring result update unit 41-$i$ sets a value obtained by subtracting one from the dictionary match length of the updated dictionary search result SS[i-1] as the dictionary match length of the updated dictionary search result SS[i]. When both the update flag A and the update flag B of the updated dictionary search result SS[i] are false, the substring result update unit 41-*i* sets the dictionary match length of the dictionary search result ss[i] as the dictionary match length of the updated dictionary search result SS[i].

Through the above operations, the substring result update unit 41-*i* can acquire the updated dictionary search result SS[i] by using the dictionary search result ss[i] and the updated dictionary search result SS[i-1] depending on the calculation results of the update flag A and the update flag B.

Specifically, when both the dictionary match flag of the dictionary search result ss[i] and the dictionary match flag of the updated dictionary search result SS[i-1] indicate match and the value obtained by subtracting one from the dictionary match length of the updated dictionary search result SS[i-1] is greater than the dictionary match length of the dictionary search result ss[i], the substring result update unit 41-*i* acquires the updated dictionary search result SS[i] by using the updated dictionary search result SS[i-1]. In other words, the substring result update unit 41-*i* updates the dictionary search result ss[i] with the updated dictionary search result SS[i-1], thereby acquiring the updated dictionary search result SS[i]. In this case, the substring result update unit 41-*i* can acquire the updated dictionary search result SS[i] with the longer dictionary match length by using the updated dictionary search result SS[i-1] as compared with the case of using the dictionary search result ss[i].

FIG. 16 illustrates an example of the updated dictionary search results acquired by the dictionary search result update unit 35. Here, a case where the dictionary search result ss[i] of each of the four substrings ss0, ss1, ss2, and ss3 is input to the dictionary search result update unit 35 will be exemplified. The threshold of a dictionary match length is set to three.

The dictionary search result ss[0] corresponding to the substring ss0 is assumed as match (D1, 8). The dictionary search result ss[1] corresponding to the substring ss1 is assumed as unmatch. The dictionary search result ss[2] corresponding to the substring ss2 is assumed as match (D2, 3). The dictionary search result ss[3] corresponding to the substring ss3 is assumed as unmatch.

The updated dictionary search result SS[0] corresponding to the substring ss0 and the updated dictionary search result SS[1] corresponding to the substring ss1 are the same as those described above with reference to FIG. 11. That is, as the updated dictionary search result SS[0], match (D1, 8) is set. As the updated dictionary search result SS[1], match (D1, 7) is set.

A character string "2345678" that is the first seven characters of the substring ss2 matches a character string "2345678" that is seven characters beginning from the second character of the substring ss1. Therefore, the substring result update unit 40-2 may set the updated dictionary search result SS[2] corresponding to the substring ss2 by using the updated dictionary search result SS[1]. Specifically, since the dictionary match flag of the updated dictionary search result SS[1] is match, the dictionary match flag of the dictionary search result ss[2] is match, and a value obtained by subtracting one from the dictionary match length of the updated dictionary search result SS[1] is greater than the dictionary match length of the dictionary search result ss[2] (that is, the update flag B of the updated dictionary search result SS[1] is true), the substring result update unit 40-2 sets the updated dictionary search result SS[2] by using the updated dictionary search result SS[1]. As a result, match (D1, 6) is set as the updated dictionary search result SS[2].

A character string "3456789" that is the first seven characters of the substring ss3 matches a character string "3456789" that is seven characters beginning from the second character of the substring ss2. Therefore, the substring result update unit 40-3 may set the updated dictionary search result SS[3] corresponding to the substring ss3 by using the updated dictionary search result SS[2]. Specifically, since the dictionary match flag of the updated dictionary search result SS[2] is match, the dictionary match flag of the dictionary search result ss[3] is unmatch, and the dictionary match length of the updated dictionary search result SS[2] is equal to or greater than the threshold (that is, the update flag A of the updated dictionary search result SS[3] is true), the substring result update unit 40-3 sets the updated dictionary search result SS[3] by using the updated dictionary search result SS[2]. As a result, match (D1, 5) is set as the updated dictionary search result SS[3].

In this manner, in a case where the update flag B is true in addition to a case where the update flag A is true, the dictionary search result ss[i] corresponding to the i-th substring is updated with the updated dictionary search result SS[i-1] corresponding to the immediately preceding substring, thereby acquiring the updated dictionary search result SS[i]. As a result, the dictionary compressor 21 according to the second embodiment can improve the compression efficiency of the input data 61 as compared with the dictionary compressor 21 according to the first embodiment.

Figure 17:
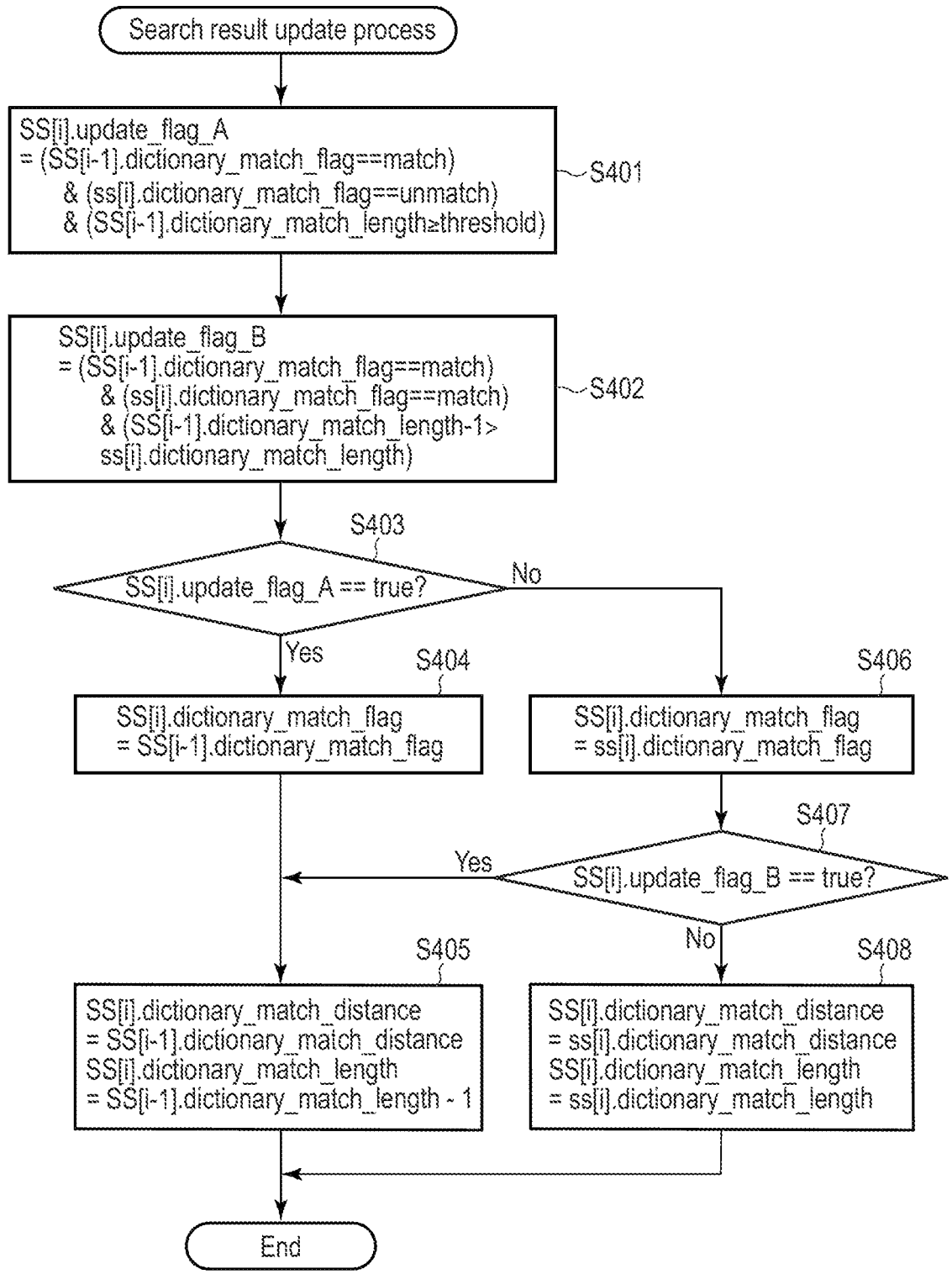
FIG. 17 is a flowchart illustrating an example of the procedure of a search result update process executed in the dictionary compressor according to the second embodiment.

FIG. 17 is a flowchart illustrating an example of the procedure of a search result update process executed in the dictionary compressor 21. The search result update process is a process of acquiring an updated dictionary search result by using a dictionary search result generated by the dictionary match comparison unit 34. The search result update process corresponds to step S102 of the encoding process described above with reference to FIG. 12. Here, a case where the search result update process is performed on the i-th dictionary search result ss[i] of M dictionary search results ss[0] to ss[M-1] to acquire an updated dictionary search result SS[i] will be exemplified. The dictionary search result ss[i] and the updated dictionary search result SS[i] correspond to the i-th substring of the M substrings that are processed in parallel.

In the search result update process for acquiring the updated dictionary search result SS[i], the dictionary search result ss[i] and the (i-k)-th updated dictionary search result SS[i-k] are used. Therefore, the search result update process for acquiring the updated dictionary search result SS[i] is performed after the search result update process for acquiring the updated dictionary search result SS[i-k] has been completed. In a case where i is equal to or less than (the first data length −1), k is any integer between one and i. In a case where i is greater than (the first data length −1), k is any integer between one and (the first data length −1). In a case where i is zero and k is one, there is no updated dictionary search result SS[i-k], and thus, the dictionary search result ss[0] is used directly as the updated dictionary search result SS[0]. In the following description of the search result update process, a case where i is an integer of one or more and k is one will be exemplified.

First, the dictionary search result update unit 35 of the dictionary compressor 21 sets, as the update flag A of the updated dictionary search result SS[i] corresponding to the i-th substring, a logical AND of (a) a value indicating whether or not the dictionary match flag of the updated dictionary search result SS[i-1] corresponding to the (i-1)-th substring is match, (b) a value indicating whether or not the dictionary match flag of the dictionary search result ss[i] is unmatch, and (c) a value indicating whether or not the dictionary match length of the updated dictionary search result SS[i-1] is equal to or greater than a threshold (step S401).

Then, the dictionary search result update unit 35 sets, as the update flag B of the updated dictionary search result SS[i], a logical AND of (a) a value indicating whether or not the dictionary match flag of the updated dictionary search result SS[i-1] is match, (b) a value indicating whether or not the dictionary match flag of the dictionary search result ss[i] is match, and (c) a value indicating whether or not a value obtained by subtracting one from the dictionary match length of the updated dictionary search result SS[i-1] is greater than the dictionary match length of the dictionary search result ss[i] (step S402).

The dictionary search result update unit 35 determines whether or not the set update flag A of the updated dictionary search result SS[i] is true (step S403).

When the update flag A of the updated dictionary search result SS[i] is true (Yes in step S403), the dictionary search result update unit 35 sets the dictionary match flag of the updated dictionary search result SS[i-1] as the dictionary match flag of the updated dictionary search result SS[i] (step S404). The dictionary search result update unit 35 sets the dictionary match distance of the updated dictionary search result SS[i-1] as the dictionary match distance of the updated dictionary search result SS[i], and sets the value obtained by subtracting one from the dictionary match length of the updated dictionary search result SS[i-1] as the dictionary match length of the updated dictionary search result SS[i] (step S405). Then, the dictionary search result update unit 35 ends the search result update process.

When the update flag A of the updated dictionary search result SS[i] is false (No in step S403), the dictionary search result update unit 35 sets the dictionary match flag of the dictionary search result ss[i] as the dictionary match flag of the updated dictionary search result SS[i] (step S406). Then, the dictionary search result update unit 35 determines whether or not the update flag B of the updated dictionary search result SS[i] is true (step S407).

When the update flag B of the updated dictionary search result SS[i] is true (Yes in step S407), the dictionary search result update unit 35 sets the dictionary match distance of the updated dictionary search result SS[i-1] as the dictionary match distance of the updated dictionary search result SS[i], and sets the value obtained by subtracting one from the dictionary match length of the updated dictionary search result SS[i-1] as the dictionary match length of the updated dictionary search result SS[i] (step S405). The update flag B being true indicates that both the dictionary match flag of the updated dictionary search result SS[i-1] and the dictionary match flag of the dictionary search result ss[i] are match, and the value obtained by subtracting one from the dictionary match length of the updated dictionary search result SS[i-1] is equal to or greater than the dictionary match length of the dictionary search result ss[i]. The compression efficiency of the input data 61 may be improved as dictionary match length to which a data string in the input data 61 is converted increases. Therefore, the dictionary search result update unit 35 sets the dictionary match distance and the dictionary match length of the updated dictionary search result SS[i] by using the updated dictionary search result SS[i-1] in order to set a longer dictionary match length for the updated dictionary search result SS[i]. Then, the dictionary search result update unit 35 ends the search result update process.

When the update flag B of the updated dictionary search result SS[i] is false (No in step S407), the dictionary search result update unit 35 sets the dictionary match distance of the dictionary search result ss[i] as the dictionary match distance of the updated dictionary search result SS[i], and sets the dictionary match length of the dictionary search result ss[i] as the dictionary match length of the updated dictionary search result SS[i] (step S408). That is, the dictionary search result update unit 35 sets the dictionary match distance and the dictionary match length of the dictionary search result ss[i] directly as the dictionary match distance and the dictionary match length of the updated dictionary search result SS[i], respectively. Then, the dictionary search result update unit 35 ends the search result update process.

Through the above search result update process, the dictionary search result update unit 35 can acquire, for the i-th substring, the updated dictionary search result SS[i] by using the dictionary search result ss[i] and the updated dictionary search result SS[i-1].

Third Embodiment

In the dictionary compressor 21 according to the first embodiment, the update flag A is used to determine whether or not to update the dictionary search result. In the dictionary compressor 21 according to the second embodiment, the update flag A and the update flag B are used to determine whether or not to update the dictionary search result.

In contrast, in a dictionary compressor 21 according to a third embodiment, an update flag C is further used in addition to the update flag A and the update flag B to determine whether or not to update the dictionary search result. The dictionary compressor 21 according to the third embodiment also updates the dictionary search result [i] of the i-th substring when the update flag C indicates that: the dictionary match flag of the updated dictionary search result SS[i-1] is match, the dictionary match flag of the dictionary search result ss[i] is match, a value obtained by subtracting one from the dictionary match length of the updated dictionary search result SS[i-1] is equal to the dictionary match length of the dictionary search result ss[i], and the dictionary match distance of the updated dictionary search result SS[i-1] is less than the dictionary match distance of the dictionary search result ss[i].

A configuration of a memory system 3 including the dictionary compressor 21 according to the third embodiment is similar to those of the memory systems 3 including the dictionary compressors 21 according to the first and second embodiments. The third embodiment is different from the first and second embodiments in terms of the procedure of a process executed by the substring result update unit 41 of the dictionary search result update unit 35. Hereinafter, differences from the first and second embodiments will be mainly described.

FIG. 18 illustrates an example of an operation of a substring result update unit 41-$i$ expressed by a program. The substring result update unit 41-$i$ performs the following operations (C1) to (C6).

(C1) The substring result update unit 41-$i$ calculates the update flag A of the updated dictionary search result SS[i] in the same manner as in (A1) described above with reference to FIG. 10.

(C2) The substring result update unit 41-*i* calculates the update flag B of the updated dictionary search result SS[i] in the same manner as in (B2) described above with reference to FIG. 15.

(C3) The substring result update unit 41-*i* calculates, as the update flag C of the updated dictionary search result SS[i], a logical AND of (a) a value indicating whether or not the dictionary match flag of the updated dictionary search result SS[i-1] is match, (b) a value indicating whether or not the dictionary match flag of the dictionary search result ss[i] is match, (c) a value indicating whether or not a value obtained by subtracting one from the dictionary match length of the updated dictionary search result SS[i-1] is equal to the dictionary match length of the dictionary search result ss[i], and (d) a value indicating whether or not the dictionary match distance of the updated dictionary search result SS[i-1] is less than the dictionary match distance of the dictionary search result ss[i].

(C4) The substring result update unit 41-*i* sets either the dictionary match flag of the updated dictionary search result SS[i-1] or the dictionary match flag of the dictionary search result ss[i] as the dictionary match flag of the updated dictionary search result SS[i] in the same manner as in (A3) described above with reference to FIG. 10.

(C5) When at least any of the update flag A, the update flag B, and the update flag C of the updated dictionary search result SS[i] is true, the substring result update unit 41-*i* sets the dictionary match distance of the updated dictionary search result SS[i-1] as the dictionary match distance of the updated dictionary search result SS[i]. When the update flag A, the update flag B, and the update flag C of the updated dictionary search result SS[i] are all false, the substring result update unit 41-*i* sets the dictionary match distance of the dictionary search result ss[i] as the dictionary match distance of the updated dictionary search result SS[i].

(C6) The substring result update unit 41-*i* sets either the value obtained by subtracting one from the dictionary match length of the updated dictionary search result SS[i-1] or the dictionary match length of the dictionary search result ss[i] as the dictionary match length of the updated dictionary search result SS[i] in the same manner as in (B5) described above with reference to FIG. 15.

Through the above operations, the substring result update unit 41-*i* can acquire the updated dictionary search result SS[i] by using the dictionary search result ss[i] and the updated dictionary search result SS[i-1] depending on the calculation results of the update flag A, the update flag B, and the update flag C.

More specifically, the substring result update unit 41-*i* acquires the updated dictionary search result SS[i] by using the updated dictionary search result SS[i-1] when both the dictionary match flag of the dictionary search result ss[i] and the dictionary match flag of the updated dictionary search result SS[i-1] indicate match, the value obtained by subtracting one from the dictionary match length of the updated dictionary search result SS[i-1] is equal to the dictionary match length of the dictionary search result ss[i], and the dictionary match distance of the updated dictionary search result SS[i-1] is less than the dictionary match distance of the dictionary search result ss[i]. In other words, the substring result update unit 41-*i* updates the dictionary search result ss[i] with the updated dictionary search result SS[i-1], thereby acquiring the updated dictionary search result SS[i]. The substring result update unit 41-*i* can acquire the updated dictionary search result SS[i] with the shorter dictionary match distance by using the updated dictionary search result SS[i-1] as compared with the case of using the dictionary search result ss[i]. For example, in deflate, a shorter code word is allocated to a symbol indicating a shorter dictionary match distance. Therefore, the compression efficiency of the input data 61 may be improved by acquiring the updated dictionary search result SS[i] indicating the shorter dictionary match distance.

FIG. 19 illustrates an example of the updated dictionary search results acquired by the dictionary search result update unit 35. Here, a case where the dictionary search result ss[i] of each of the four substrings ss0, ss1, ss2, and ss3 is input to the dictionary search result update unit 35 will be exemplified. Further, the threshold of a dictionary match length is set to three.

The dictionary search result ss[0] corresponding to the substring ss0 is assumed as match (64, 8). The dictionary search result ss[1] corresponding to the substring ss1 is assumed as unmatch. The dictionary search result ss[2] corresponding to the substring ss2 is assumed as match (4000, 6). The dictionary search result ss[3] corresponding to the substring ss3 is assumed as unmatch.

The updated dictionary search result SS[0] corresponding to the substring ss0 and the updated dictionary search result SS[1] corresponding to the substring ss1 are similar to those in the example described above with reference to FIG. 11. That is, as the updated dictionary search result SS[0], match (64, 8) is set. As the updated dictionary search result SS[1], match (64, 7) is set.

A character string "2345678" of the first seven characters of the substring ss2 matches a character string "2345678" of seven characters beginning from the second character of the substring ss1. Therefore, the substring result update unit 40-2 may set the updated dictionary search result SS[2] corresponding to the substring ss2 by using the updated dictionary search result SS[1]. More specifically, since the dictionary match flag of the updated dictionary search result SS[1] is match, the dictionary match flag of the dictionary search result ss[2] is match, a value obtained by subtracting one from the dictionary match length of the updated dictionary search result SS[1] is equal to the dictionary match length of the dictionary search result ss[2], and the dictionary match distance of the updated dictionary search result SS[1] is less than the dictionary match distance of the dictionary search result ss[2] (that is, since the update flag C of the updated dictionary search result SS[1] is true), the substring result update unit 40-2 sets the updated dictionary search result SS[2] by using the updated dictionary search result SS[1]. As a result, match (64, 6) is set as the updated dictionary search result SS[2].

A character string "3456789" of the first seven characters of the substring ss3 matches a character string "3456789" of seven characters beginning from the second character of the substring ss2. Therefore, the substring result update unit 40-3 may set the updated dictionary search result SS[3] corresponding to the substring ss3 by using the updated dictionary search result SS[2]. More specifically, since the dictionary match flag of the updated dictionary search result SS[2] is match, the dictionary match flag of the dictionary search result ss[3] is unmatch, and the dictionary match length of the updated dictionary search result SS[2] is equal to or greater than the threshold (that is, since the update flag A of the updated dictionary search result SS[3] is true), the substring result update unit 40-3 sets the updated dictionary search result SS[3] by using the updated dictionary search result SS[2]. As a result, match (64, 5) is set as the updated dictionary search result SS[3].

In this manner, in a case where the update flag C is true in addition to a case where the update flag A is true and a case where the update flag B is true, the dictionary search result ss[i] corresponding to the i-th substring is updated with the updated dictionary search result SS[i-1] corresponding to the immediately preceding substring, thereby acquiring the updated dictionary search result SS[i]. As a result, the dictionary compressor 21 according to the third embodiment may improve the compression efficiency of the input data 61 as compared with the dictionary compressors 21 according to the first and second embodiments.

Figure 20:
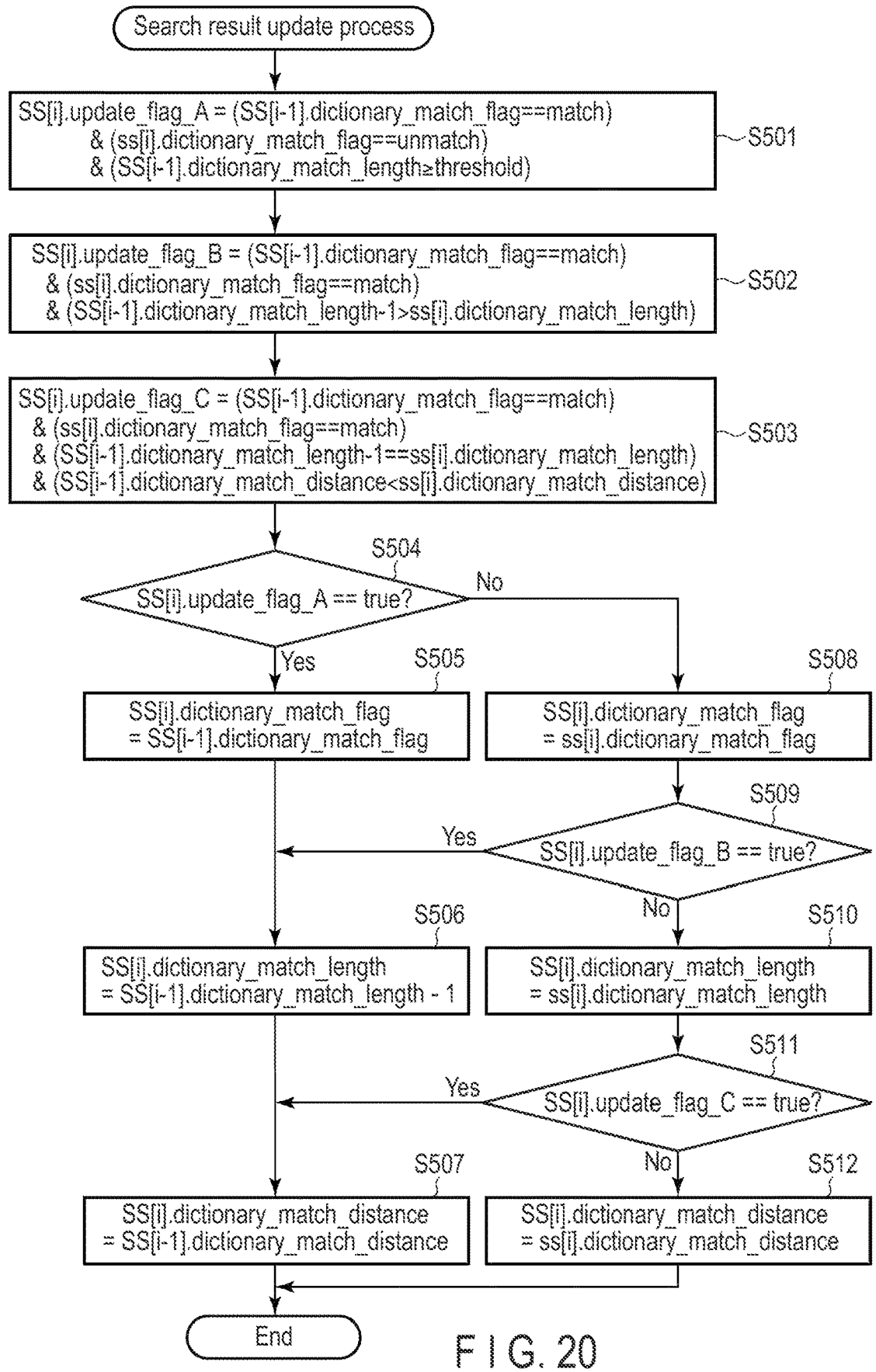
FIG. 20 is a flowchart illustrating an example of the procedure of a search result update process executed in the dictionary compressor according to the third embodiment.

FIG. 20 is a flowchart illustrating an example of the procedure of a search result update process executed in the dictionary compressor 21. The search result update process is a process of acquiring an updated dictionary search result by using a dictionary search result generated by the dictionary match comparison unit 34. The search result update process corresponds to step S102 of the encoding process described above with reference to FIG. 12. Here, a case where the search result update process is performed on an i-th dictionary search result ss[i] of M dictionary search results ss[0] to ss[M-1] to acquire an updated dictionary search result SS[i] will be exemplified. The dictionary search result ss[i] and the updated dictionary search result SS[i] correspond to the i-th substring of the M substrings that are processed in parallel.

Note that in the search result update process for acquiring the updated dictionary search result SS[i], the dictionary search result ss[i] and the (i-k)-th updated dictionary search result SS[i-k] are used. Therefore, the search result update process for acquiring the updated dictionary search result SS[i] is performed after the search result update process for acquiring the updated dictionary search result SS[i-k] has been completed. In a case where i is equal to or less than (the first data length -1), k is any integer between one and i. In a case where i is greater than (the first data length -1), k is any integer between one and (the first data length -1). In a case where i is zero and k is one, there is no updated dictionary search result SS[i-k], and thus, the dictionary search result ss[0] is used directly as the updated dictionary search result SS[0]. In the following description of the search result update process, a case where i is an integer of one or more and k is one will be exemplified.

The procedure of steps S501 and S502 is similar to the procedure of steps S401 and S402 of the search result update process described above with reference to FIG. 17. Through the procedure of steps S501 and S502, the dictionary search result update unit of the dictionary compressor 21 acquires the updated dictionary search result SS[i] in which true or false is set to each of the update flag A and the update flag B.

Next, the dictionary search result update unit 35 sets, as the update flag C of the updated dictionary search result SS[i], a logical AND of (a) a value indicating whether or not the dictionary match flag of the updated dictionary search result SS[i-1] is match, (b) a value indicating whether or not the dictionary match flag of the dictionary search result ss[i] is match, (c) a value indicating whether or not a value obtained by subtracting one from the dictionary match length of the updated dictionary search result SS[i-1] is equal to the dictionary match length of the dictionary search result ss[i], and (d) a value indicating whether or not the dictionary match distance of the updated dictionary search result SS[i-1] is less than the dictionary match distance of the dictionary search result ss[i] (step S503).

The dictionary search result update unit 35 determines whether or not the set update flag A of the updated dictionary search result SS[i] is true (step S504).

When the update flag A of the updated dictionary search result SS[i] is true (Yes in step S504), the dictionary search result update unit 35 sets the dictionary match flag of the updated dictionary search result SS[i-1] as the dictionary match flag of the updated dictionary search result SS[i] (step S505). The dictionary search result update unit 35 sets the value obtained by subtracting one from the dictionary match length of the updated dictionary search result SS[i-1] as the dictionary match length of the updated dictionary search result SS[i] (step S506). Then, the dictionary search result update unit 35 sets the dictionary match distance of the updated dictionary search result SS[i-1] as the dictionary match distance of the updated dictionary search result SS[i] (step S507), and ends the search result update process.

When the update flag A of the updated dictionary search result SS[i] is false (No in step S504), the dictionary search result update unit 35 sets the dictionary match flag of the dictionary search result ss[i] as the dictionary match flag of the updated dictionary search result SS[i] (step S508). Then, the dictionary search result update unit 35 determines whether or not the update flag B of the updated dictionary search result SS[i] is true (step S509).

When the update flag B of the updated dictionary search result SS[i] is true (Yes in step S509), the dictionary search result update unit 35 performs the above-described procedure of steps S506 and S507, and ends the search result update process.

When the update flag B of the updated dictionary search result SS[i] is false (No in step S509), the dictionary search result update unit 35 sets the dictionary match length of the dictionary search result ss[i] as the dictionary match length of the updated dictionary search result SS[i] (step S510). Then, the dictionary search result update unit 35 determines whether or not the update flag C of the updated dictionary search result SS[i] is true (step S511).

When the update flag C of the updated dictionary search result SS[i] is true (Yes in step S511), the dictionary search result update unit 35 sets the dictionary match distance of the updated dictionary search result SS[i-1] as the dictionary match distance of the updated dictionary search result SS[i] (step S507). The update flag C being true indicates that both the dictionary match flag of the updated dictionary search result SS[i-1] and the dictionary match flag of the dictionary search result ss[i] are match, the value obtained by subtracting one from the dictionary match length of the updated dictionary search result SS[i-1] is equal to the dictionary match length of the dictionary search result ss[i], and the dictionary match distance of the updated dictionary search result SS[i-1] is shorter than the dictionary match distance of the dictionary search result ss[i]. For example, in deflate, a code word with a shorter code length is allocated to a symbol with a shorter dictionary match distance, and a code word with a longer code length is allocated to a symbol with a longer dictionary match distance. Therefore, the compression efficiency of the input data 61 can be improved since a code word with a shorter code length is allocated as the dictionary match distance is shorter. Therefore, the dictionary search result update unit 35 sets the dictionary match distance of the updated dictionary search result SS[i] by using the updated dictionary search result SS[i-1] in order to set a shorter dictionary match distance to the updated dictionary search result SS[i]. Then, the dictionary search result update unit 35 ends the search result update process.

When the update flag C of the updated dictionary search result SS[i] is false (No in step S511), the dictionary search result update unit 35 sets the dictionary match distance of the dictionary search result ss[i] as the dictionary match distance of the updated dictionary search result SS[i] (step S512). That is, the dictionary search result update unit 35 sets the dictionary match distance of the dictionary search result ss[i] directly as the dictionary match distance of the updated dictionary search result SS[i]. Then, the dictionary search result update unit 35 ends the search result update process.

Through the above search result update process, the dictionary search result update unit 35 can acquire, for the i-th substring, the updated dictionary search result SS[i] by using the dictionary search result ss[i] and the updated dictionary search result SS[i-1].

As described above, the data compression efficiency can be improved according to the first to third embodiments. In the dictionary compressor 21 for compressing input first data, the history buffer 33 stores data that is input to the dictionary compressor 21 prior to the first data. The hash calculation unit 31 and the dictionary match comparison unit 34 acquire partial data strings (for example, substrings 62) from the first data. The partial data strings each have a first data length. The partial data strings have head positions in the first data, respectively, that are sequentially shifted by a second data length that is shorter than the first data length. The hash calculation unit 31 and the dictionary match comparison unit 34 performs search processes in parallel. The search processes search the history buffer 33 to acquire respective match data strings (dictionary match candidates) that at least partially match the partial data strings, respectively. The hash calculation unit 31 and the dictionary match comparison unit 34 acquires search results (for example, dictionary search results ss[0] to ss[M-1]) that correspond to the search processes, respectively. The dictionary search result update unit 35 update, by using a first search result of the search results, a second search result of the search results that is different from the first search result. The first search result corresponds to a search process of searching the history buffer 33 to acquire a match data string that at least partially matches a first partial data string of the partial data strings. The second search result corresponds to a search process of searching the history buffer 33 to acquire a match data string that at least partially matches a second partial data string of the partial data strings which is posterior to the first partial data string.

The dictionary compressor 21 may improve the compression efficiency of the input data 61 by using the updated second search result. The updated second search result is acquired by using the first search result. Therefore, the dictionary compressor 21 can improve the compression efficiency of the input data 61 while maintaining a high throughput without changing hardware resources of the history buffer 33 (for example, the number of read ports for each bank).

Each of various functions described in the first to third embodiments may be realized by a circuit (e.g., processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A dictionary compressor for compressing input first data, the dictionary compressor comprising:
   a buffer configured to store data that is input to the dictionary compressor prior to the first data;
   a search unit configured to:
      acquire partial data strings from the first data, the partial data strings each having a first data length, the partial data strings having head positions in the first data, respectively, that are sequentially shifted by a second data length that is shorter than the first data length;
      perform search processes in parallel, the search processes searching the buffer to acquire respective match data strings that at least partially match the partial data strings, respectively; and
      acquire search results that correspond to the search processes, respectively; and
   an update unit configured to update, by using a first search result of the search results, a second search result of the search results that is different from the first search result, wherein
   the first search result corresponds to a search process of searching the buffer to acquire a match data string that at least partially matches a first partial data string of the partial data strings, and
   the second search result corresponds to a search process of searching the buffer to acquire a match data string that at least partially matches a second partial data string of the partial data strings which is posterior to the first partial data string.

2. The dictionary compressor according to claim 1, wherein
   an (i-k)-th search result of the search results includes:
      first match information indicating that it has been determined that a first match data string that at least partially matches an (i-k)-th partial data string of the partial data strings is stored in the buffer;
      first match distance information indicating a first match distance which is a distance from a position where the (i-k)-th partial data string is to be stored to a position where the first match data string is stored in the buffer; and
      first match length information indicating a first match length which is a length of a matching portion between the (i-k)-th partial data string and the first match data string,
   an i-th search result of the search results includes:
      second match information indicating that it has been determined that a second match data string that at least partially matches an i-th partial data string of the partial data strings is not stored in the buffer;
      second match distance information; and
      second match length information,
   the update unit is configured to, in a case where the first match length is equal to or greater than a threshold:
      update the second match information to indicate that it has been determined that a third match data string that matches at least a part of the i-th partial data string is stored in the buffer;

update the second match distance information to indicate the first match distance; and update the second match length information to indicate a length obtained by subtracting k from the first match length, k is any integer between one and i in a case where i is equal to or less than a value obtained by subtracting one from the first data length, and k is any integer between one and the value obtained by subtracting one from the first data length in a case where i is greater than the value obtained by subtracting one from the first data length.

3. The dictionary compressor according to claim 2, wherein the buffer includes storage areas on which reading operations are executable in parallel, a first storage area of the storage areas stores the first match data string and the second match data string, the search unit is configured to, in accordance with the first match data string that has been read from the first storage area by a specific timing:

acquire the first match data string that at least partially matches the (i-k)-th partial data string; and acquire the (i-k)-th search result that includes the first match information, the first match distance information, and the first match length information, and the search unit is configured to, in accordance with the second match data string that has not been read from the first storage area by the specific timing, acquire the i-th search result that includes the second match information, the second match distance information, and the second match length information, the second match information indicating that it has been determined that the second match data string that at least partially matches the i-th partial data string is not stored in the buffer.

4. The dictionary compressor according to claim 1, wherein an (i-k)-th search result of the search results includes:

first match information indicating that it has been determined that a first match data string that at least partially matches an (i-k)-th partial data string of the partial data strings is stored in the buffer;

first match distance information indicating a first match distance which is a distance from a position where the (i-k)-th partial data string is to be stored to a position where the first match data string is stored in the buffer; and first match length information indicating a first match length which is a length of a matching portion between the (i-k)-th partial data string and the first match data string, an i-th search result of the search results includes:

second match information indicating that it has been determined that a second match data string that at least partially matches an i-th partial data string of the partial data strings is stored in the buffer;

second match distance information indicating a second match distance which is a distance from a position where the i-th partial data string is to be stored to a position where the second match data string is stored in the buffer; and second match length information indicating a second match length which is a length of a matching portion between the i-th partial data string and the second match data string, the update unit is configured to, in a case where a length obtained by subtracting k from the first match length is longer than the second match length:

update the second match distance information to indicate the first match distance; and update the second match length information to indicate a length obtained by subtracting k from the first match length, k is any integer between one and i in a case where i is equal to or less than a value obtained by subtracting one from the first data length, and k is any integer between one and the value obtained by subtracting one from the first data length in a case where i is greater than the value obtained by subtracting one from the first data length.

5. The dictionary compressor according to claim 1, wherein an (i-k)-th search result of the search results includes:

first match information indicating that it has been determined that a first match data string that at least partially matches an (i-k)-th partial data string of the partial data strings is stored in the buffer;

first match distance information indicating a first match distance which is a distance from a position where the (i-k)-th partial data string is to be stored to a position where the first match data string is stored in the buffer; and first match length information indicating a first match length which is a length of a matching portion between the (i-k)-th partial data string and the first match data string, an i-th search result of the search results includes:

second match information indicating that it has been determined that a second match data string that at least partially matches an i-th partial data string of the partial data strings is stored in the buffer;

second match distance information indicating a second match distance which is a distance from a position where the i-th partial data string is to be stored to a position where the second match data string is stored in the buffer; and second match length information indicating a second match length which is a length of a matching portion between the i-th partial data string and the second match data string, the update unit is configured to update the second match distance information to indicate the first match distance in a case where a length obtained by subtracting k from the first match length is equal to the second match length and the first match distance is shorter than the second match distance, k is any integer between one and i in a case where i is equal to or less than a value obtained by subtracting one from the first data length, and k is any integer between one and the value obtained by subtracting one from the first data length when i is greater than the value obtained by subtracting one from the first data length.

6. The dictionary compressor according to claim 1, further comprising a selection unit configured to select at least one search result from the search results that include the updated second search result.

7. A data compression device comprising:
the dictionary compressor according to claim 6; and
an entropy coding unit configured to perform entropy coding on the selected at least one search result.

8. A memory system comprising:
a controller comprising:
the dictionary compressor according to claim 6; and
an entropy coding unit configured to generate compressed data by performing entropy coding on the selected at least one search result; and
a nonvolatile memory,
wherein the controller is configured to write the compressed data into the nonvolatile memory.

9. A dictionary compression method for compressing first data input to a compressor, the dictionary compression method comprising:
storing data that is input to the compressor prior to the first data, to a buffer in the compressor;
acquiring partial data strings from the first data, the partial data strings each having a first data length, the partial data strings having head positions in the first data, respectively, that are sequentially shifted by a second data length that is shorter than the first data length;
performing search processes in parallel, the search processes searching the buffer to acquire respective match data strings that at least partially match the partial data strings, respectively;
acquiring search results that correspond to the search processes, respectively; and
updating, by using a first search result of the search results, a second search result of the search results that is different from the first search result, wherein
the first search result corresponds to a search process of searching the buffer to acquire a match data string that at least partially matches a first partial data string of the partial data strings, and
the second search result corresponds to a search process of searching the buffer to acquire a match data string that at least partially matches a second partial data string of the partial data strings which is posterior to the first partial data string.

10. The dictionary compression method according to claim 9, wherein
an (i-k)-th search result of the search results includes:
first match information indicating that it has been determined that a first match data string that at least partially matches an (i-k)-th partial data string of the partial data strings is stored in the buffer;
first match distance information indicating a first match distance which is a distance from a position where the (i-k)-th partial data string is to be stored to a position where the first match data string is stored in the buffer; and
first match length information indicating a first match length which is a length of a matching portion between the (i-k)-th partial data string and the first match data string,
an i-th search result of the search results includes:
second match information indicating that it has been determined that a second match data string that at least partially matches an i-th partial data string of the partial data strings is not stored in the buffer;
second match distance information; and
second match length information, the dictionary compression method comprises, in a case where the first match length is equal to or greater than a threshold:
updating the second match information to indicate that it has been determined that a third match data string that matches at least a part of the i-th partial data string is stored in the buffer;
updating the second match distance information to indicate the first match distance; and
updating the second match length information to indicate a length obtained by subtracting k from the first match length,
k is any integer between one and i in a case where i is equal to or less than a value obtained by subtracting one from the first data length, and
k is any integer between one and the value obtained by subtracting one from the first data length in a case where i is greater than the value obtained by subtracting one from the first data length.

11. The dictionary compression method according to claim 10, wherein
the buffer includes storage areas on which reading operations are executable in parallel,
a first storage area of the storage areas stores the first match data string and the second match data string,
the dictionary compression method comprises, in accordance with the first match data string that has been read from the first storage area by a specific timing:
acquiring the first match data string that at least partially matches the (i-k)-th partial data string; and
acquiring the (i-k)-th search result that includes the first match information, the first match distance information, and the first match length information, and
the dictionary compression method comprises, in accordance with the second match data string that has not been read from the first storage area by the specific timing, acquiring the i-th search result that includes the second match information, the second match distance information, and the second match length information, the second match information indicating that it has been determined that the second match data string that at least partially matches the i-th partial data string is not stored in the buffer.

12. The dictionary compression method according to claim 9, wherein
an (i-k)-th search result of the search results includes:
first match information indicating that it has been determined that a first match data string that at least partially matches an (i-k)-th partial data string of the partial data strings is stored in the buffer;
first match distance information indicating a first match distance which is a distance from a position where the (i-k)-th partial data string is to be stored to a position where the first match data string is stored in the buffer; and
first match length information indicating a first match length which is a length of a matching portion between the (i-k)-th partial data string and the first match data string,
an i-th search result of the search results includes:
second match information indicating that it has been determined that a second match data string that at least partially matches an i-th partial data string of the partial data strings is stored in the buffer;
second match distance information indicating a second match distance which is a distance from a position where the i-th partial data string is to be stored to a position where the second match data string is stored in the buffer; and second match length information indicating a second match length which is a length of a matching portion between the i-th partial data string and the second match data string, the dictionary compression method comprises, in a case where a length obtained by subtracting k from the first match length is longer than the second match length:
  updating the second match distance information to indicate the first match distance; and
  updating the second match length information to indicate a length obtained by subtracting k from the first match length, k is any integer between one and i in a case where i is equal to or less than a value obtained by subtracting one from the first data length, and k is any integer between one and the value obtained by subtracting one from the first data length in a case where i is greater than the value obtained by subtracting one from the first data length.

13. The dictionary compression method according to claim 9, wherein
  an (i-k)-th search result of the search results includes:
    first match information indicating that it has been determined that a first match data string that at least partially matches an (i-k)-th partial data string of the partial data strings is stored in the buffer;
    first match distance information indicating a first match distance which is a distance from a position where the (i-k)-th partial data string is to be stored to a position where the first match data string is stored in the buffer; and
    first match length information indicating a first match length which is a length of a matching portion between the (i-k)-th partial data string and the first match data string,
  an i-th search result of the search results includes:
    second match information indicating that it has been determined that a second match data string that at least partially matches an i-th partial data string of the partial data strings is stored in the buffer;
    second match distance information indicating a second match distance which is a distance from a position where the i-th partial data string is to be stored to a position where the second match data string is stored in the buffer; and
    second match length information indicating a second match length which is a length of a matching portion between the i-th partial data string and the second match data string,
  the dictionary compression method comprises updating the second match distance information to indicate the first match distance in a case where a length obtained by subtracting k from the first match length is equal to the second match length and the first match distance is shorter than the second match distance,
  k is any integer between one and i in a case where i is equal to or less than a value obtained by subtracting one from the first data length, and
  k is any integer between one and the value obtained by subtracting one from the first data length when i is greater than the value obtained by subtracting one from the first data length.

14. The dictionary compression method according to claim 9, further comprising
  selecting at least one search result from the search results that include the updated second search result.

* * * * *